(12) United States Patent
Kim et al.

(10) Patent No.: US 11,887,654 B2
(45) Date of Patent: Jan. 30, 2024

(54) VERTICAL MEMORY DEVICE

(71) Applicant: SK hynix Inc., Gyeonggi-do (KR)

(72) Inventors: Seung-Hwan Kim, Seoul (KR);
Su-Ock Chung, Seoul (KR);
Seon-Yong Cha, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/739,944

(22) Filed: May 9, 2022

(65) Prior Publication Data
US 2022/0262425 A1 Aug. 18, 2022

Related U.S. Application Data

(63) Continuation of application No. 16/854,382, filed on Apr. 21, 2020, now Pat. No. 11,355,177.

(30) Foreign Application Priority Data

Jul. 12, 2019 (KR) .................... 10-2019-0084689

(51) Int. Cl.
*G11C 7/10* (2006.01)
*G11C 11/408* (2006.01)
(Continued)

(52) U.S. Cl.
CPC ........ *G11C 11/4085* (2013.01); *H01L 23/528* (2013.01); *H01L 28/86* (2013.01); *H10B 12/30* (2023.02); *H10B 12/50* (2023.02)

(58) Field of Classification Search
CPC .... G11C 11/4085; H10B 12/30; H10B 12/50; H10B 23/528; H10B 28/86
(Continued)

(56) References Cited

U.S. PATENT DOCUMENTS 7,649,763 B2 * 1/2010 Takashima ............. G11C 11/22
257/245
10,535,659 B2 * 1/2020 Kim ....................... H10B 12/30
(Continued)

FOREIGN PATENT DOCUMENTS

CN 106486151 A 3/2017
CN 107731826 A 2/2018
(Continued)

OTHER PUBLICATIONS

Office Action issued by the Chinese Patent Office for Application No. 202010435754.5 dated Jul. 1, 2023.
(Continued)

*Primary Examiner* — Viet Q Nguyen
(74) *Attorney, Agent, or Firm* — IP & T GROUP LLP

(57) ABSTRACT

A memory device includes: a first memory cell mat that includes first multi-layer level sub word lines positioned over a substrate; a second memory cell mat that is laterally spaced apart from the first memory cell mat and includes second multi-layer level sub word lines; a first sub word line driver circuit that is positioned underneath the first memory cell mat; and a second sub word line driver circuit that is positioned underneath the second memory cell mat, wherein the first sub word line driver circuit is positioned underneath ends of the first multi-layer level sub word lines, and the second sub word line driver circuit is positioned underneath ends of the second multi-layer level sub word lines.

11 Claims, 31 Drawing Sheets

(51) Int. Cl.
  *H01L 49/02* (2006.01)
  *H01L 23/528* (2006.01)
  *H10B 12/00* (2023.01)
(58) Field of Classification Search
  USPC .................................................. 365/189.08
  See application file for complete search history.

(56) References Cited

U.S. PATENT DOCUMENTS

| | | | |
|---|---|---|---|
| 11,355,177 B2* | 6/2022 | Kim | H01L 28/86 |
| 11,386,950 B2* | 7/2022 | Park | H10B 12/33 |
| 11,501,827 B2* | 11/2022 | Kim | H10B 12/05 |
| 11,700,725 B2* | 7/2023 | Choi | H10B 12/05 |
| | | | 257/296 |
| 11,721,377 B2* | 8/2023 | Tang | G11C 11/2275 |
| | | | 365/145 |
| 11,723,186 B2* | 8/2023 | Ryu | H10B 12/05 |
| 2007/0236979 A1 | 10/2007 | Takashima | |
| 2012/0063209 A1* | 3/2012 | Koyama | H10B 12/50 |
| | | | 365/230.06 |
| 2018/0323199 A1 | 11/2018 | Roberts et al. | |
| 2019/0103407 A1* | 4/2019 | Kim | H10B 12/30 |
| 2019/0252386 A1 | 8/2019 | Lee et al. | |
| 2020/0111512 A1 | 4/2020 | Kim et al. | |
| 2022/0068859 A1* | 3/2022 | Choi | G11C 5/025 |

FOREIGN PATENT DOCUMENTS

| | | |
|---|---|---|
| JP | 2004006479 A | 1/2004 |
| KR | 20090125969 A | 12/2009 |
| WO | 2018222237 A1 | 12/2018 |

OTHER PUBLICATIONS

Notice of Allowance for Korean Patent Application No. 10-2019-0084689 issued by the Korean Patent Office dated Dec. 4, 2023.

* cited by examiner

VERTICAL MEMORY DEVICE

CROSS-REFERENCE TO RELATED APPLICATIONS

This application is a continuation of U.S. patent application Ser. No. 16/854,382 filed on Apr. 21, 2020, which claims benefits of priority of Korean Patent Application No. 10-2019-0084689 filed on Jul. 12, 2019. The disclosure of each of the foregoing application is incorporated herein by reference in its entirety.

BACKGROUND

1. Field

Various embodiments of the present invention relate generally to a semiconductor device and, more particularly, to a memory device.

2. Description of the Related Art

Recently, the size of memory cells continues to be decreased in order to increase the net die of a memory device.

As the size of the memory cells is miniaturized, a parasitic capacitance has to be decreased while capacitance is increased. However, it is difficult to increase the net die due to structural limitations of the memory cells.

SUMMARY

Embodiments of the present invention are directed to highly integrated vertical memory cell arrays, and a memory device including the highly integrated vertical memory cell arrays.

In accordance with an embodiment of the present invention, a memory device includes: a first memory cell mat that includes first multi-layer level sub word lines positioned over a substrate; a second memory cell mat that is laterally spaced apart from the first memory cell mat and includes second multi-layer level sub word lines; a first sub word line driver circuit that is positioned underneath the first memory cell mat; and a second sub word line driver circuit that is positioned underneath the second memory cell mat, wherein the first sub word line driver circuit is positioned underneath ends of the first multi-layer level sub word lines, and the second sub word line driver circuit is positioned underneath ends of the second multi-layer level sub word lines.

In accordance with another embodiment of the present invention, a memory device includes: a memory cell mat that includes multi-layer level sub word lines which are stacked in a direction perpendicular to an upper surface of a substrate; a sub word line driver circuit that is positioned underneath the memory cell mat and includes a plurality of sub word line drivers which respectively drive the multi-layer level sub word lines; a first level interconnection that electrically connects the multi-layer level sub word lines and the sub word line drivers to each other; and a second level interconnection that receives activation signals of the sub word line drivers and is positioned at a higher level than the first level interconnection.

In accordance with another embodiment of the present invention, a memory device includes: a sub word line driver circuit that includes sub word line drivers positioned over a substrate; a bit line and a plate line each of which is vertically oriented over the sub word line drivers; multi-layer level sub word lines that are positioned between the bit line and the plate line and arranged in a direction perpendicular to the substrate; and an interconnection that electrically connects the multi-layer level word lines to the sub word line drivers, wherein the sub word line drivers are positioned underneath ends of the multi-layer level sub word lines.

In accordance with another embodiment of the present invention, a memory device includes: first and second cell mats, each cell mat comprising a plurality of sub word line stacks, each sub word line stack including at least two vertically stacked sub word lines forming a step structure on two opposite ends of the sub word line stack, a sub word line driver circuit positioned underneath each of the first and second cell mats; and interconnections electrically coupling respective ends of each sub word line of each sub word line stack to the sub word line driver circuit.

DETAILED DESCRIPTION

Figure 1:
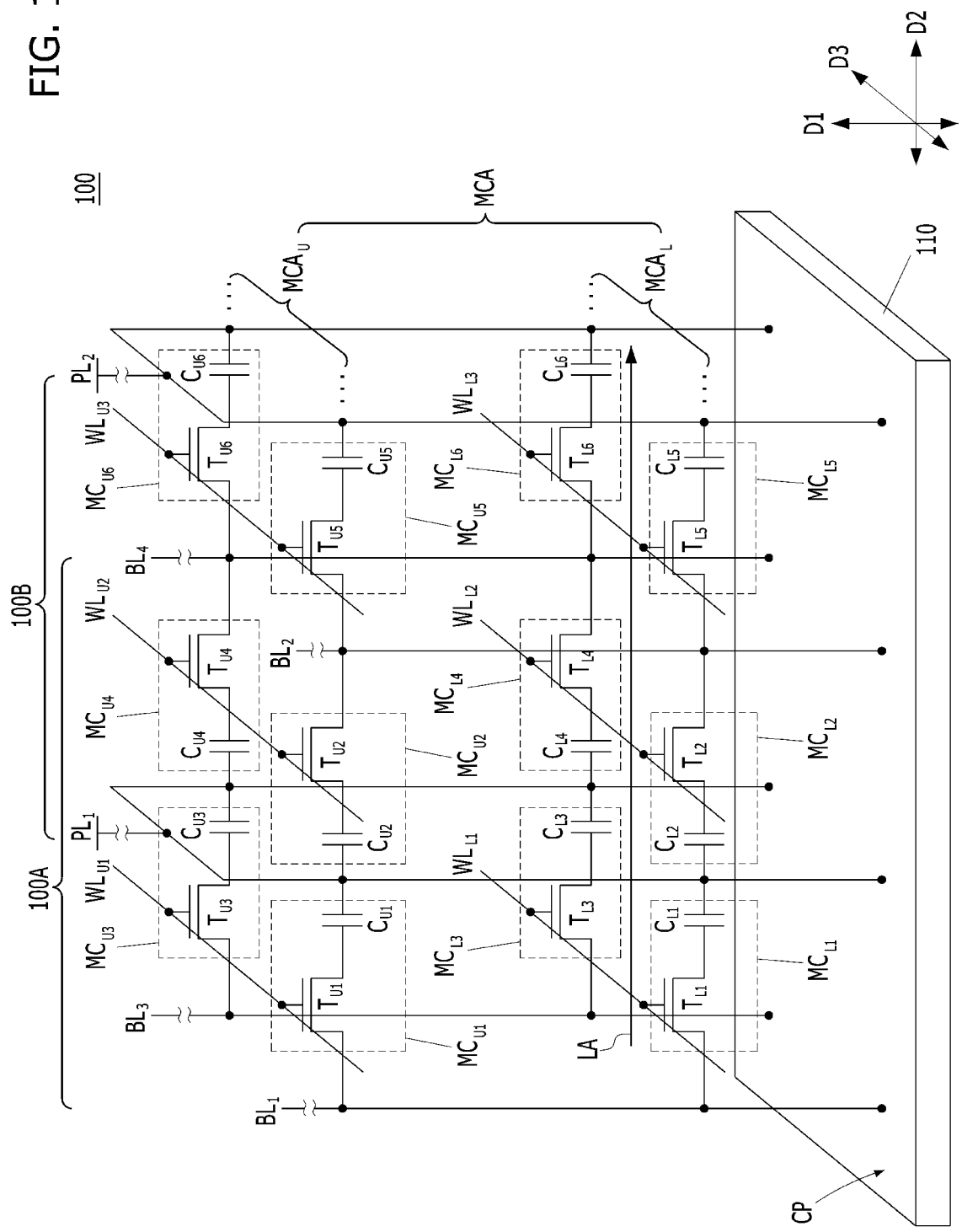
FIG. 1 is an equivalent circuit diagram illustrating a memory device according to an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also to a case where a third layer exists between the first layer and the second layer or the substrate.

According to the following embodiments of the present invention, memory cell density may be increased and parasitic capacitance may be reduced by vertically stacking memory cells.

Figure 2:
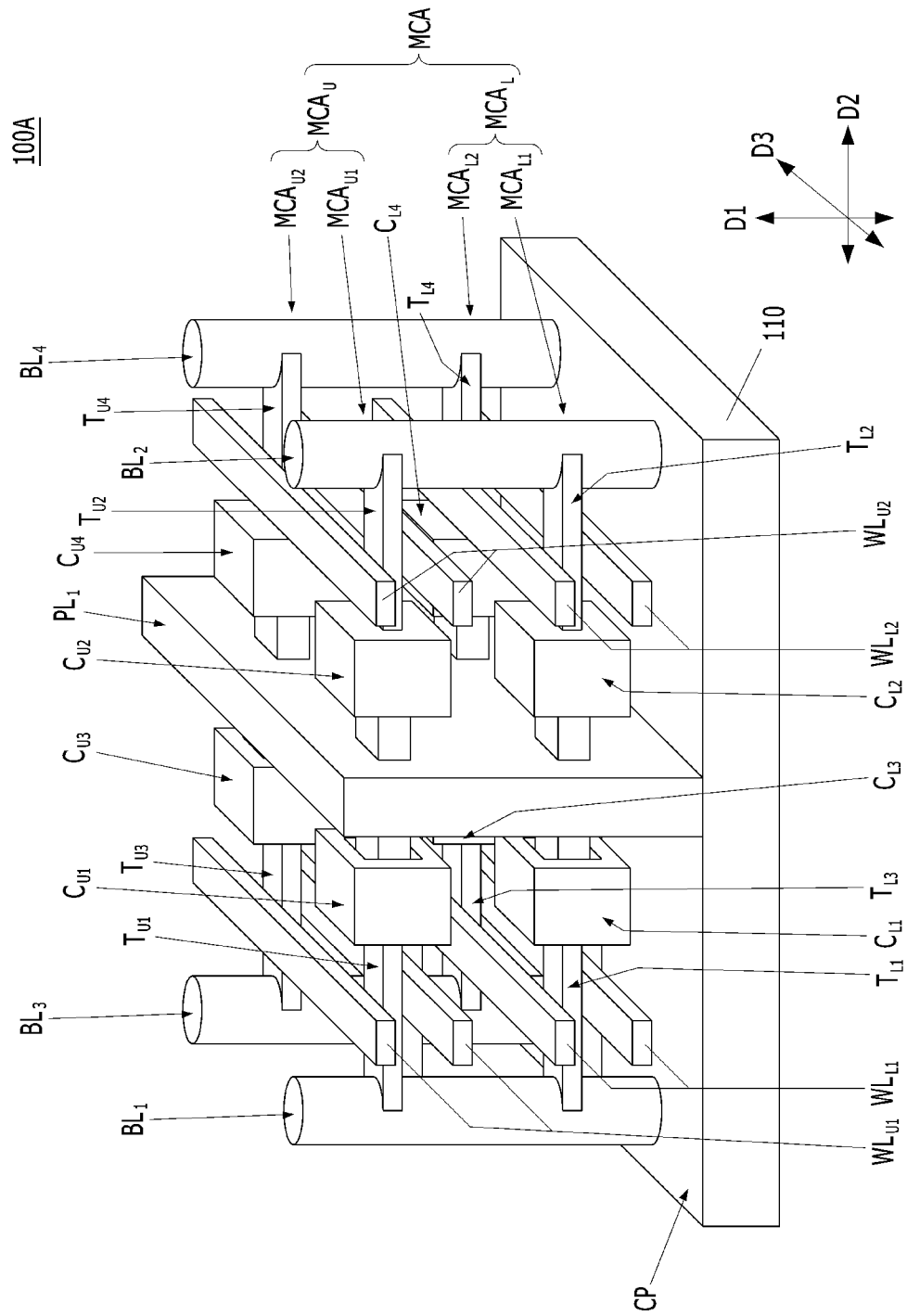
FIG. 2 is a perspective view illustrating a mirror-like structure sharing a plate line of FIG. 1.
Figure 3:
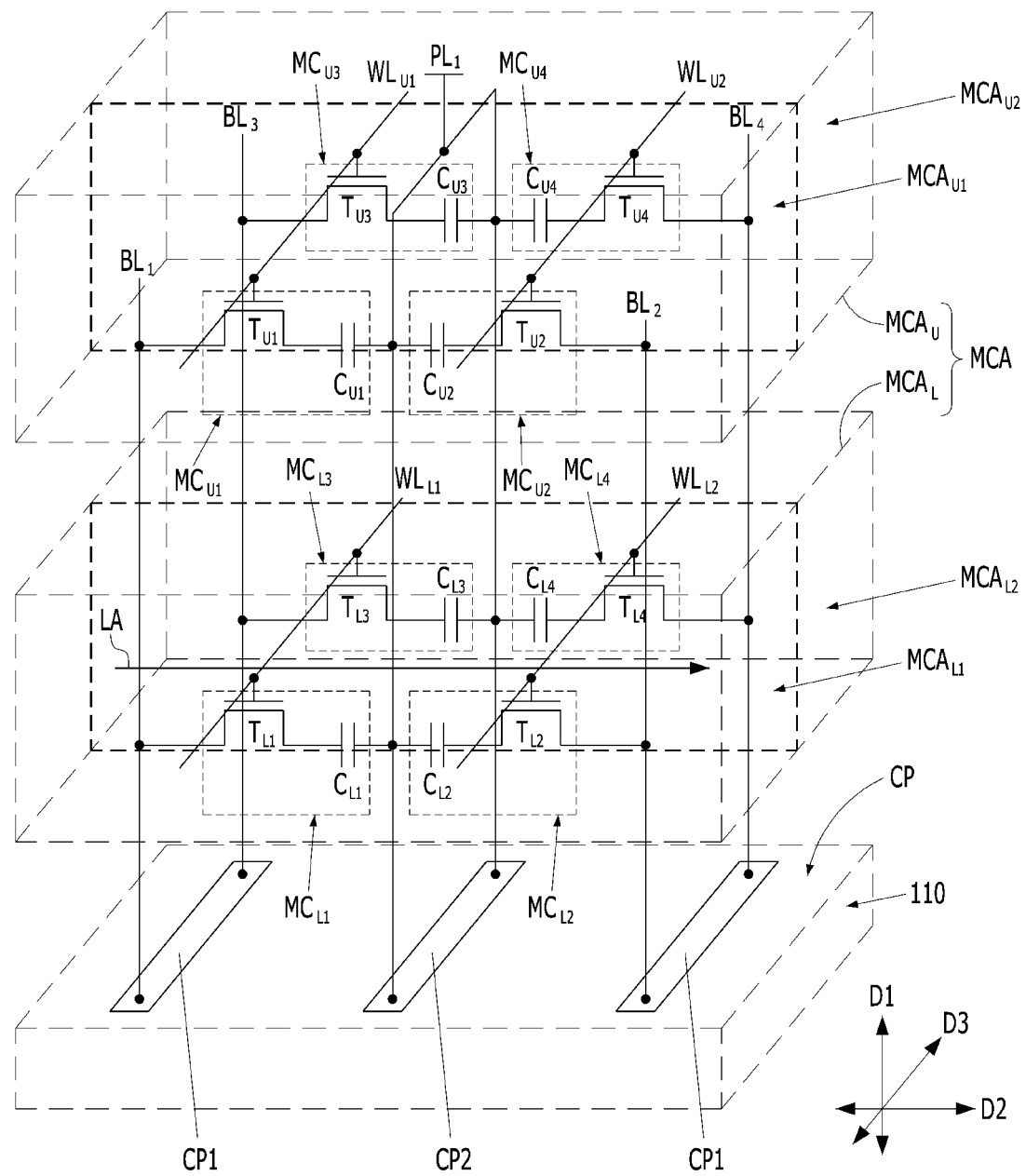
FIG. 3 is an equivalent circuit diagram illustrating the mirror-like structure shown in FIG. 2.
Figure 4:
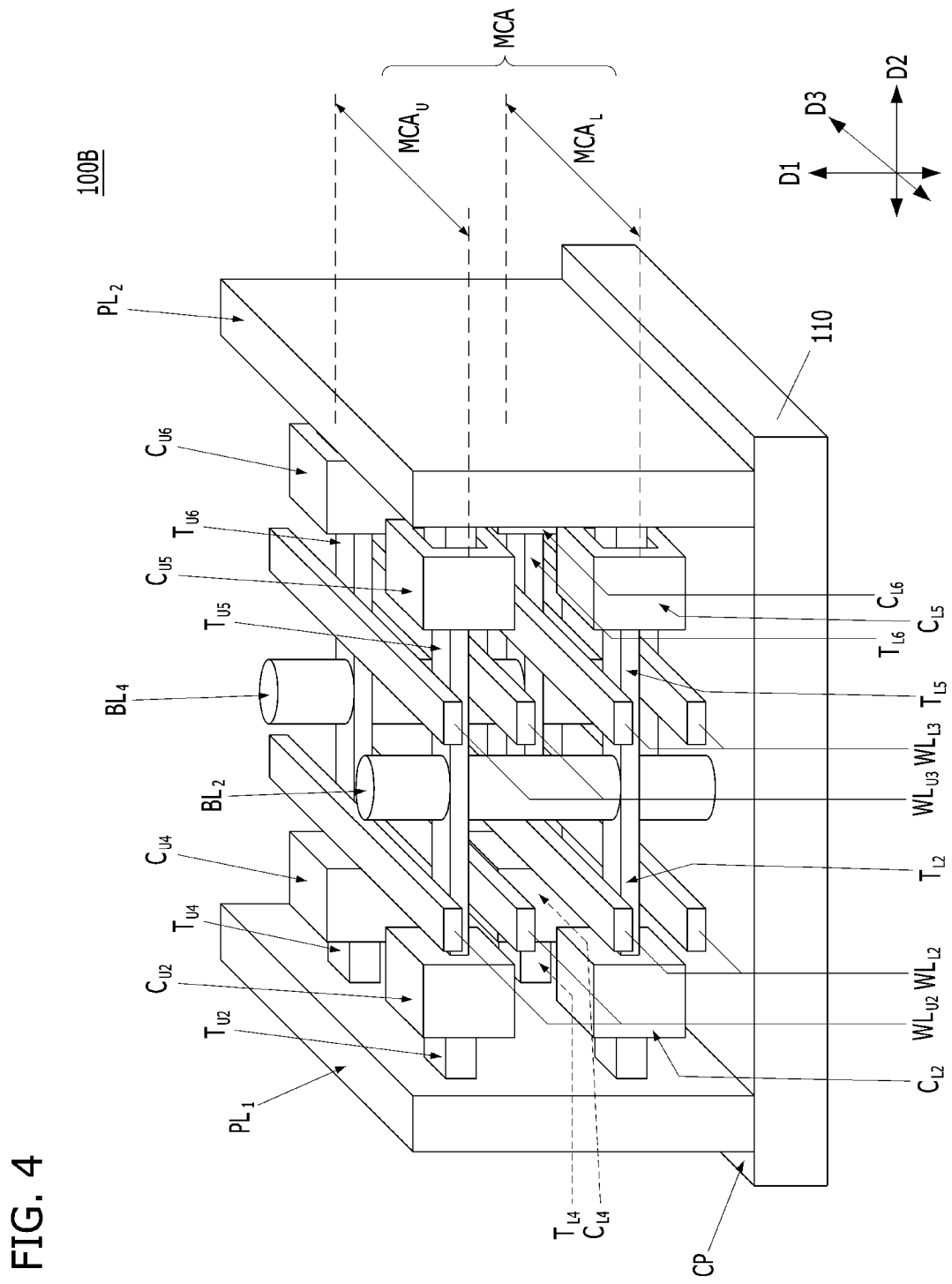
FIG. 4 is a perspective view illustrating a mirror-like structure sharing a bit line shown in FIG. 1.
Figure 5:
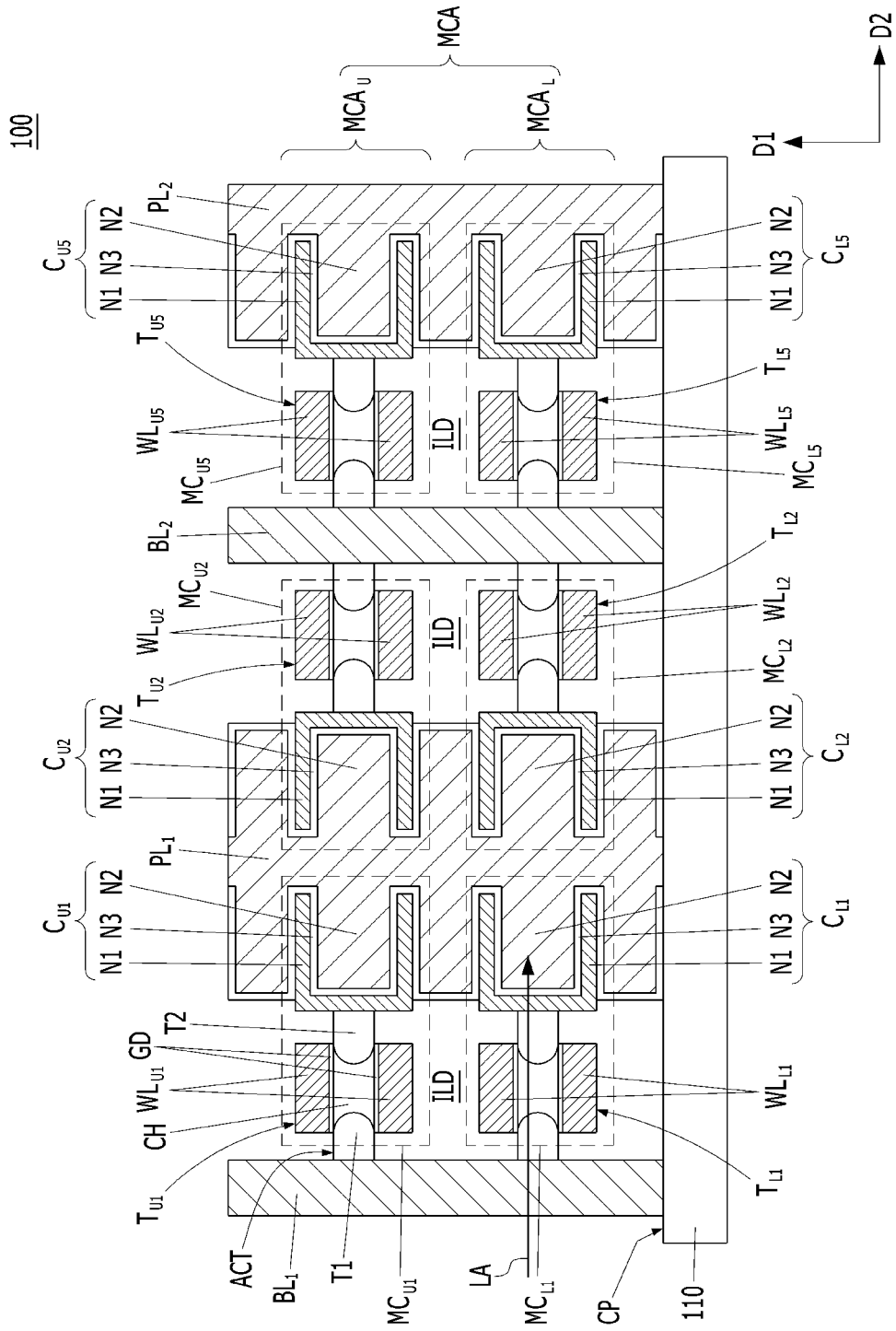
FIG. 5 is a cross-sectional view illustrating the memory device shown in FIG. 1.
Figure 6:
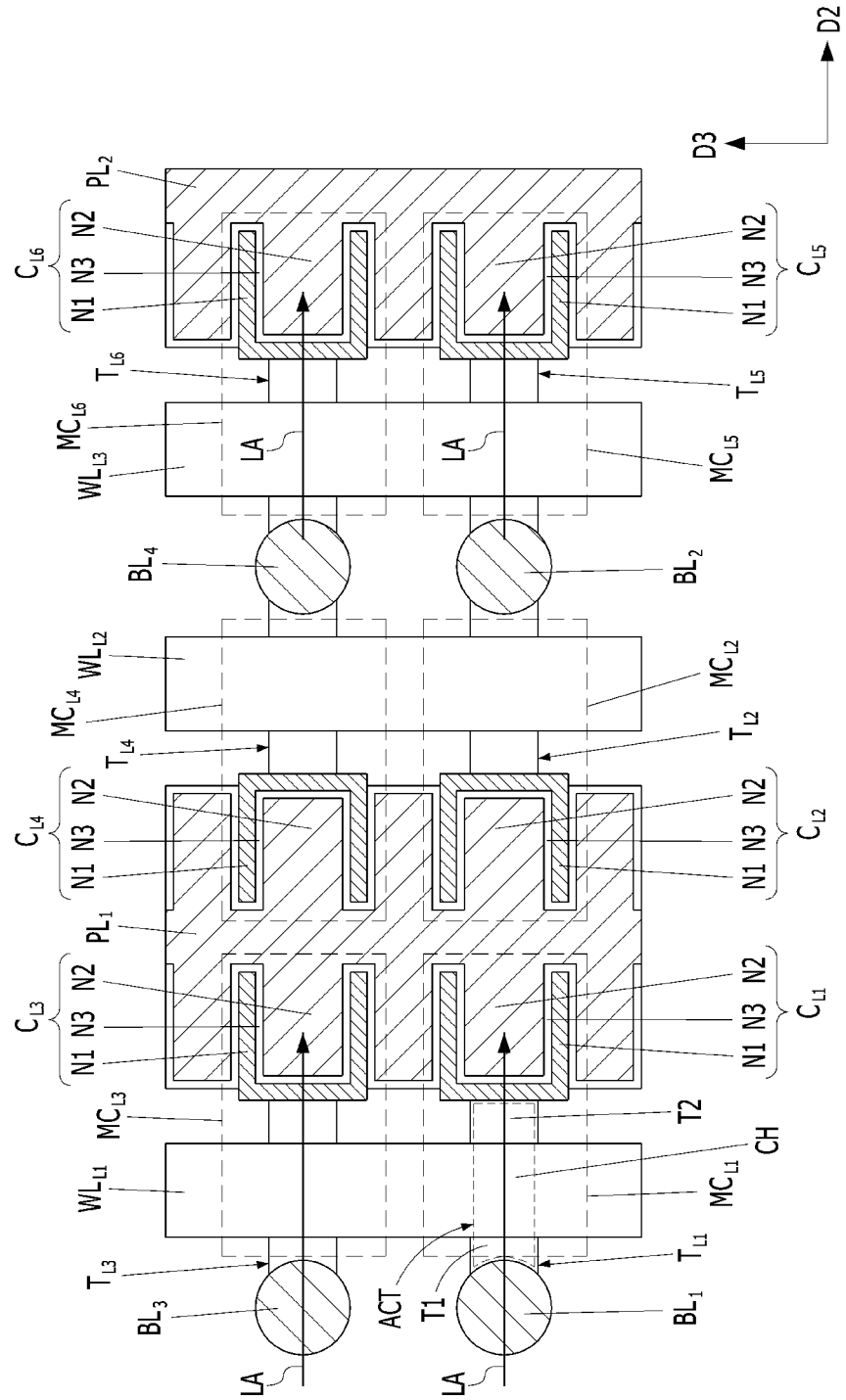
FIG. 6 is a plan view illustrating the memory device shown in FIG. 1.

FIG. 1 is an equivalent circuit diagram illustrating a memory device according to an embodiment of the present invention. FIG. 2 is a perspective view illustrating a mirror-like structure 100A sharing a plate line of FIG. 1. FIG. 3 is an equivalent circuit diagram illustrating the mirror-like structure shown in FIG. 2. FIG. 4 is a perspective view illustrating a mirror-like structure 100B sharing a bit line shown in FIG. 1. FIG. 5 is a cross-sectional view illustrating the memory device shown in FIG. 1. FIG. 6 is a plan view illustrating the memory device shown in FIG. 1.

The memory device 100 may include a peripheral structure 110 and a memory cell array stack MCA. The memory cell array stack MCA may be positioned above the peripheral structure 110. The memory cell array stack MCA may include a plurality of memory cell arrays $MCA_L$ and $MCA_U$. The positioning of the memory cell array MCA relatively to the peripheral circuit 110 may vary according to various implementations of the present invention. For example, according to another embodiment of the present invention, the memory cell array stack MCA may be positioned below the peripheral structure 110.

The memory cell array stack MCA may include at least two memory cell arrays $MCA_L$ and $MCA_U$ stacked over the peripheral structure 110. The at least two memory cell arrays $MCA_L$ and $MCA_U$ may be vertically stacked over the peripheral structure 110. Generally, an n number of memory cell arrays may be stacked in the memory cell array, where n is an integer equal to or greater than 2. According to an embodiment, the at least two memory cell arrays $MCA_L$ and $MCA_U$ may form one pair of memory cell arrays and the memory cell array stack MCA may include a plurality of pairs of memory cell arrays stacked over the peripheral structure 110. The plurality of pairs of memory cell arrays may be stacked vertically over the peripheral structure 110. In another embodiment, a plurality of pairs of memory cell arrays may be laterally arranged over the peripheral structure 110, each pair being identical to the pair of the at least two memory cell arrays $MCA_L$ and $MCA_U$.

The peripheral structure 110 may include a material suitable for semiconductor processing including, for example, a semiconductor material. For example, the peripheral structure 110 may include a semiconductor substrate made of a semiconductor material, such as a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, or a combination thereof. The peripheral structure 110 may include a single-layer semiconductor substrate. The peripheral structure 110 may include a multi-layer semiconductor substrate. The peripheral structure 110 may include other semiconductor materials such as germanium. The peripheral structure 110 may include a III/V-group semiconductor substrate, for example, a compound semiconductor substrate such as GaAs. The peripheral structure 110 may include an SOI (Silicon-On-Insulator) substrate. The peripheral structure 110 may have a stacked structure of a semiconductor substrate and a dielectric material.

The surface of the peripheral structure 110 may include a plane CP. The memory cell array stack MCA may be positioned vertically over the plane CP of the peripheral structure 110. The memory cell array stack MCA may be formed in a first direction D1 perpendicular to the surface, i.e., the plane CP, of the peripheral structure 110. The first direction D1 may be a direction perpendicular to the plane CP, and the second direction D2 and the third direction D3 may be directions parallel to the plane CP. The second direction D2 and the third direction D3 may intersect with each other, and the first direction D1 may intersect with the second direction D2 and the third direction D3. The two memory cell arrays $MCA_L$ and $MCA_U$ may be grouped as one pair and a plurality of the pairs may be vertically stacked over the peripheral structure 110 in the first direction D1.

The plane CP of the peripheral structure 110 may include a first plane CP1 and a second plane CP2. The first plane CP1 and the second plane CP2 may be spaced apart from each other in a second direction D2 which is perpendicular to the first direction D1. The first plane CP1 and the second plane CP2 may be surfaces of the same material. The first plane CP1 and the second plane CP2 may be surfaces of different materials. The first plane CP1 and the second plane CP2 may be electrically insulated. The plane CP may be provided by a dielectric material. The top surface of the peripheral structure 110 may provide the plane CP. The top surface of the peripheral structure 110 may be of a dielectric material or a conductive material. The first plane CP1 and the second plane CP2 may be of a dielectric material or a conductive material. The first plane CP1 may be of a conductive material and the second plane CP2 may be of a dielectric material.

The two memory cell arrays $MCA_L$ and $MCA_U$ may be arranged above the plane CP of the peripheral structure 110. For the sake of convenience in description, the two memory cell arrays $MCA_L$ and $MCA_U$ may be respectively called a lower memory cell array $MCA_L$ and an upper memory cell array $MCA_U$. A plurality of pairs each of which includes the two memory cell arrays $MCA_L$ and $MCA_U$ may be laterally arranged in a third direction D3 over the peripheral structure 110. For example, referring to FIGS. 2 and 3, the lower memory cell arrays $MCA_{L1}$ and $MCA_{L2}$ may be laterally arranged along the third direction D3, and the upper memory cell arrays $MCA_{U1}$ and $MCA_{U2}$ may be laterally arranged along the third direction D3.

The memory cell array stack MCA may include a plurality of word lines $WL_{L1}$, $WL_{L2}$, $WL_{L3}$, $WL_{U1}$, $WL_{U2}$, and $WL_{U3}$, a plurality of bit lines $BL_1$, $BL_2$, $BL_3$ and $BL_4$, a plurality of memory cells $MC_{L1}$, $MC_{L2}$ and $MC_{L3}$, $MC_{L4}$, $MC_{L5}$, $MC_{L6}$, $MC_{U1}$, $MC_{U2}$, $MC_{U3}$, $MC_{U4}$, $MC_{U5}$ and $MC_{U6}$, and a plurality of plate lines $PL_1$ and $PL_2$. The number of word lines, the number of bit lines, the number of memory cells, and the number of plate lines are not limited and may vary according to various implementations of the present invention.

The lower memory cell array $MCA_L$ may include a plurality of word lines $WL_{L1}$, $WL_{L2}$ and $WL_{L3}$, a plurality of bit lines $BL_1$, $BL_2$, $BL_3$ and $BL_4$, a plurality of memory cells $MC_{L1}$, $MC_{L2}$, $MC_{L3}$, $MC_{L4}$, $MC_{L5}$ and $MC_{L6}$, and a plurality of plate lines $PL_1$ and $PL_2$. The upper memory cell array $MCA_U$ may include a plurality of word lines $WL_{U1}$, $WL_{U2}$ and $WL_{U3}$, a plurality of bit lines $BL_1$, $BL_2$, $BL_3$ and $BL_4$, a plurality of memory cells $MC_{U1}$, $MC_{U2}$, $MC_{U3}$, $MC_{U4}$, $MC_{L5}$ and $MC_{L6}$, and a plurality of plate lines $PL_1$ and $PL_2$.

The bit lines $BL_1$, $BL_2$, $BL_3$ and $BL_4$ may extend along the first vertical direction D1 from the plane CP of the peripheral structure 110. The bit lines $BL_1$, $BL_2$, $BL_3$ and $BL_4$ may each be in direct contact with the plane CP of the peripheral structure 110. The bit lines $BL_1$, $BL_2$, $BL_3$ and $BL_4$ may be vertically oriented from a plane CP. The bit lines $BL_1$, $BL_2$, $BL_3$ and $BL_4$ may be referred to as vertically oriented bit lines VBL. The bit lines $BL_1$, $BL_2$, $BL_3$ and $BL_4$ may be parallel to each other while spaced apart from each other. The bit lines $BL_1$, $BL_2$, $BL_3$ and $BL_4$ may be independently arranged laterally while spaced apart from each other in the second direction D2 and the third direction D3. The bit lines $BL_1$ and $BL_2$ may be arranged independently along the second direction D2. The bit lines $BL_1$ and $BL_3$ may be independently arranged along the third direction D3. The bit lines $BL_2$ and $BL_4$ may be independently arranged along the third direction D3.

Memory cell $MC_{L1}$ may be coupled to bit line $BL_1$. Memory cell $MC_{U1}$ may be coupled to bit line $BL_1$. Memory cells $MC_{L1}$ and $MC_{U1}$ may be arranged vertically along the first direction D1 and may be coupled to bit line $BL_1$. The lower memory cell array $MCA_L$ and the upper memory cell array $MCA_U$ may share bit line $BL_1$. Memory cells $MC_{L1}$ and $MC_{U1}$ may be stacked vertically from the plane CP between the bit line $BL_1$ and the plate line $PL_1$. Bit line $BL_3$ may be positioned laterally away from the bit line $BL_1$ along the third direction D3. The bit line $BL_3$ may be vertically oriented from the plane CP. Memory cells $MC_{L3}$ and $MC_{U3}$ may be stacked vertically from the plane CP between the bit line $BL_3$ and the plate line $PL_1$. The memory cells $MC_{L1}$ and $MC_{U1}$ may each be commonly coupled with the plate line $PL_1$ and the bit line $BL_1$. The memory cells $MC_{L3}$ and $MC_{U3}$ may each be commonly coupled with the plate line $PL_1$ and the bit line $BL_3$.

Referring now to the bit line $BL_2$, memory cell $MC_{L2}$ may be coupled to the bit line $BL_2$. Memory cell $MC_{U2}$ may be coupled to the bit line $BL_2$. Memory cells $MC_{L2}$ and $MC_{U2}$ may be arranged vertically in the first direction D1 and may be coupled to bit line $BL_2$. The lower memory cell array $MCA_L$ and the upper memory cell array $MCA_U$ may share bit line $BL_2$. Bit line $BL_4$ may be positioned laterally away from the bit line $BL_2$ along the third direction D3. The bit line $BL_4$ may be vertically oriented from the plane CP. Memory cells $MC_{L4}$ and $MC_{U4}$ may be stacked vertically from the plane CP between the bit line $BL_4$ and the plate line $PL_1$. Memory cells $MC_{L2}$ and $MC_{U2}$ may be stacked vertically from the plane CP between the bit line $BL_2$ and the plate line $PL_1$. The memory cells $MC_{L2}$ and $MC_{U2}$ may each be commonly coupled with plate line $PL_1$ and the bit line $BL_2$. The memory cells $MC_{L4}$ and $MC_{U4}$ may each be commonly coupled with plate line $PL_1$ and the bit line $BL_4$.

Memory cell $MC_{L3}$ may be coupled to the bit line $BL_3$. Memory cell $MC_{U3}$ may be coupled to the bit line $BL_3$. Memory cells $MC_{L3}$ and $MC_{U3}$ arranged vertically in the first direction D1 may be coupled to the bit line $BL_3$. The lower memory cell array $MCA_L$ and the upper memory cell array $MCA_U$ may share the bit line $BL_3$.

Memory cell $MC_{L4}$ may be coupled to bit line $BL_4$. Memory cell $MC_{U4}$ may be coupled to bit line $BL_4$. Memory cells $MC_{L4}$ and $MC_{U4}$ arranged vertically in the first direction D1 may be coupled to the bit line $BL_4$. The lower memory cell array $MCA_L$ and the upper memory cell array $MCA_U$ may share the bit line $BL_4$.

As described above, the lower memory cell array $MCA_L$ may include the bit lines $BL_1$, $BL_2$, $BL_3$ and $BL_4$. The upper memory cell array $MCA_U$ may include the bit lines $BL_1$, $BL_2$, $BL_3$ and $BL_4$. The lower memory cell array $MCA_L$ and the upper memory cell array $MCA_U$ may each be commonly coupled with each of the bit lines $BL_1$, $BL_2$, $BL_3$ and $BL_4$.

The word lines $WL_{L1}$, $WL_{L2}$, $WL_{U1}$, $WL_{U2}$, $WL_{L3}$ and $WL_{U3}$ may be parallel to the surface of the peripheral structure 110 and may each extend in the third direction D3 which intersects with the first direction D1. The word lines $WL_{L1}$, $WL_{L2}$, $WL_{U1}$, $WL_{U2}$, $WL_{L3}$ and $WL_{U3}$ may be referred to as lateral word lines. The word lines $WL_{L1}$, $WL_{L2}$, $WL_{U1}$, $WL_{U2}$, $WL_{L3}$ and $WL_{U3}$ may be arranged in a direction intersecting with the bit lines $BL_1$, $BL_2$, $BL_3$ and $BL_4$. The word lines $WL_{L1}$, $WL_{L2}$ and $WL_{L3}$ may be positioned at a first level in the first direction D1. The word lines $WL_{L1}$, $WL_{L2}$ and $WL_{L3}$ may be positioned in the lower memory cell array $MCA_L$. The word lines $WL_{L1}$, $WL_{L2}$ and $WL_{L3}$ may be arranged at a regular interval along the second direction D2 and may each extend in the third direction D3. The word lines $WL_{U1}$, $WL_{U2}$ and $WL_{U3}$ may be positioned at a second level in the first direction D1. The word lines $WL_{U1}$, $WL_{U2}$ and $WL_{U3}$ may be positioned in the upper memory cell array $MCA_U$. The word lines $WL_{U1}$, $WL_{U2}$ and $WL_{U3}$ may be arranged at a regular interval along the second direction D2 and may each extend in the third direction D3. The second level may be further away from the peripheral structure 110 than the first level.

Referring now to the word line $WL_{L1}$, memory cell $MC_{L1}$ may be coupled to the word line $WL_{L1}$. Memory cell $MC_{L3}$ may be coupled to the word line $WL_{L1}$. Memory cells $MC_{L1}$ and $MC_{L3}$ may be laterally arranged while spaced apart from each other along the third direction D3 may be coupled to the word line $WL_{L1}$. It is noted that reference to a word line being connected with a memory cell means that the gate of the word line is coupled with the word line.

Memory cell $MC_{L2}$ may be coupled to the word line $WL_{L2}$. Memory cell $MC_{L4}$ may be coupled to the word line $WL_{L2}$. Memory cells $MC_{L2}$ and $MC_{L4}$ may be laterally arranged while spaced apart from each other along the third direction D3 and may be coupled to the word line $WL_{L2}$.

Memory cell $MC_{L5}$ may be coupled to the word line $WL_{L3}$. Memory cell $MC_{L6}$ may be coupled to the word line $WL_{L3}$. Memory cells $MC_{L5}$ and $MC_{L6}$ may be laterally arranged while spaced apart from each other along the third direction D3 and may be coupled to the word line $WL_{L3}$.

Memory cell $MC_{U1}$ may be coupled to the word line $WL_{U1}$. Memory cell $MC_{U3}$ may be coupled to the word line $WL_{U1}$. Memory cells $MC_{U1}$ and $MC_{U3}$ may be laterally arranged while spaced apart from each other along the third direction D3 and may be coupled to the word line $WL_{U1}$.

Memory cell $MC_{U2}$ may be coupled to the word line $WL_{U2}$. Memory cell $MC_{U4}$ may be coupled to the word line $WL_{U2}$. Memory cells $MC_{U2}$ and $MC_{U4}$ may be laterally arranged while spaced apart from each other along the third direction D3 and may be coupled to the word line $WL_{U2}$.

Memory cell $MC_{U6}$ may be coupled to the word line $WL_{U3}$. Memory cell $MC_{U6}$ may be coupled to the word line $WL_{U3}$. Memory cells $MC_{U6}$ and $MC_{U6}$ may be laterally arranged while spaced apart from each other along the third direction D3 and may be coupled to the word line $WL_{U3}$.

As described above, the lower memory cell array $MCA_L$ may include the word lines $WL_{L1}$, $WL_{L2}$ and $WL_{L3}$ that are parallel to each other while spaced apart from each other in the second direction D2, and the upper memory cell array $MCA_U$ may include the word lines $WL_{U1}$, $WL_{U2}$ and $WL_{U3}$ that are parallel to each other while spaced apart from each other in the second direction D2.

Referring to FIG. 3, in an embodiment second plane CP2 may be disposed between left and right first planes CP1. The word line $WL_{L1}$ of the lower memory cell array $MCA_L$ and the word line $WL_{U1}$ of the upper memory cell array $MCA_U$ may be spaced apart from each other and arranged vertically from the left first plane CP1 in the first direction D1. The word line $WL_{L2}$ of the lower memory cell array $MCA_L$ and the word line $WL_{U2}$ of the upper memory cell array $MCA_U$ may be spaced apart from each other and arranged vertically from the second plane CP2 in the first direction D1. The word line $WL_{L3}$ of the lower memory cell array $MCA_L$ and the word line $WL_{U3}$ of the upper memory cell array $MCA_U$ may be spaced apart from each other and arranged vertically from the right first plane CP1 in the first direction D1.

The lower memory cell array $MCA_L$ and the upper memory cell array $MCA_U$ may each share plate line $PL_1$ and $PL_2$. (See FIG. 1) The plate lines $PL_1$ and $PL_2$ may each be oriented vertically from the plane CP of the peripheral structure 110 in the first direction D1. The plate lines $PL_1$ and $PL_2$ may be in direct contact with the plane CP of the peripheral structure 110 as illustrated in FIG. 1. However, according to a variation of the described embodiment, the plate lines $PL_1$ and $PL_2$ may not contact the plane CP of the peripheral structure 110. The plate lines $PL_1$ and $PL_2$ may intersect with the word lines $WL_{L1}$, $WL_{L2}$, $WL_{L3}$, $WL_{U1}$, $WL_{U2}$ and $WL_{U3}$ and may be parallel to the bit lines $BL_1$, $BL_2$, $BL_3$ and $BL_4$. The plate lines $PL_1$ and $PL_2$ may be set to a fixed potential (for example, a ground potential). According to the embodiment of the present invention, the plate lines $PL_1$ and $PL_2$ may be oriented in the first direction D1 vertically from the plane CP of the peripheral structure 110, and may be elongated in the direction D3 intersecting with the first direction D1. The plate lines $PL_1$ and $PL_2$ may be vertically oriented from the plane CP. The plate lines $PL_1$ and $PL_2$ may be referred to as vertical plate lines VPL. The plate lines $PL_1$ and $PL_2$ may be linear-shaped pillars extending laterally along the third direction D3 while vertically oriented in the first direction D1.

The bit lines $BL_1$, $BL_2$, $BL_3$ and $BL_4$ and the plate lines $PL_1$ and $PL_2$ may be spaced apart from each other over the plane CP. More specifically, the plate line $PL_1$ may be positioned between the bit lines $BL_1$ and $BL_2$ along the second direction D2. Referring to FIG. 3, the bit lines $BL_1$, $BL_2$, $BL_3$ and $BL_4$ may be coupled to the first plane CP1, and the plate lines $PL_1$ and $PL_2$ may be coupled to the second plane CP2. More specifically, bit lines $BL_1$, and $BL_3$ may be coupled to the left first plane CP1, the bit lines $BL_2$, and $BL_4$ may be coupled to the right first plane CP1, the plate line $PL_1$ may be coupled to the second plane CP2 which is shown disposed between the left and right planes CP1 and CP2, and the plate line $PL_2$ may be coupled to another second plane CP2 not shown in FIG. 3. The bit lines $BL_1$, $BL_2$, $BL_3$ and $BL_4$ and the plate lines $PL_1$ and $PL_2$ may be electrically insulated.

Each of the memory cells $MC_{L1}$, $MC_{L3}$, $MC_{U1}$, and $MC_{U3}$ may be positioned between a plane defined by the bit lines $BL_1$ and $BL_3$ and a plane defined by the plate line $PL_1$. Each of the memory cells $MC_{L2}$, $MC_{L4}$, $MC_{U2}$, and $MC_{U4}$ may be positioned between a plane defined by the bit lines $BL_2$ and $BL_4$ and a plane defined by the plate line $PL_2$. The memory cells $MC_{L1}$, $MC_{L2}$, and $MC_{L5}$, may be positioned in a lateral arrangement (LA) in the second direction D2. The memory cells $MC_{U1}$, $MC_{U2}$, and $MC_{U5}$ may be positioned in a lateral arrangement (LA) in the second direction D2. The memory cells $MC_{L3}$, $MC_{L4}$, and $MC_{L6}$, may be positioned in a lateral arrangement (LA) in the second direction D2 and the memory cells $MC_{U3}$, $MC_{U4}$, and $MC_{U6}$, may be positioned in a lateral arrangement (LA) in the second direction D2. The memory cells MCU, $MC_{L2}$, $MC_{L3}$, $MC_{L4}$, $MC_G$, $MC_{L6}$, $MC_{U1}$, $MC_{U2}$, $MC_{U3}$, $MC_{U4}$, $MC_{U5}$, and $MC_{U6}$ may be positioned above the peripheral structure 110 which is spaced apart from the plane CP in four levels along the first direction D1, with each level having two rows spaced apart along the third direction D3, each row extending in the second direction D2.

Memory cell $MC_{L1}$ may be coupled to the plate line $PL_1$. Memory cells $MC_{L1}$ and $MC_{U1}$ that are arranged vertically in the first direction D1 may be coupled to the plate line $PL_1$. Memory cells $MC_{L1}$ and $MC_{L2}$ may be laterally arranged while spaced apart from each other in the second direction D2 and may be coupled to the plate line $PL_1$. Memory cells $MC_{L1}$ and $MC_{L3}$ may be laterally arranged while spaced apart from each other along the third direction D3 and may be coupled to the plate line $PL_1$.

The memory cells $MC_{L1}$, $MC_{L2}$, $MC_{L3}$, $MC_{L4}$, $MC_{U1}$, $MC_{U2}$, $MC_{U3}$ and $MC_{U4}$ may include transistors $T_{L1}$, $T_{L2}$, $T_{L3}$, $T_{L4}$, $T_{U1}$, $T_{U2}$, $T_{U3}$ and $T_{U4}$ and capacitors $C_{L1}$, $C_{L2}$, $C_{L3}$, $C_{L4}$, $C_{U1}$, $C_{U2}$, $C_{U3}$ and $C_{U4}$, respectively. The transistors $T_{L1}$, $T_{L3}$, $T_{U1}$, and $T_{U3}$ and their respective capacitors $C_{L1}$, $C_{L3}$, $C_{U1}$, and $C_{U3}$ may be positioned between the plane defined by the bit lines $BL_1$, and $BL_3$ and the plane of the plate line $PL_1$. The transistors $T_{L2}$, $T_{L4}$, Tut, and $T_{U4}$ and their respective capacitors $C_{L2}$, $C_{L4}$, $C_{U2}$, and $C_{U4}$ may be positioned between the plane defined by the bit lines $BL_2$, and $BL_4$ and the plane of plate line $PL_2$ in the second direction D2. Each of the transistors $T_{L1}$, $T_{L2}$, $T_{L3}$, $T_{L4}$, $T_{U1}$, $T_{U2}$, $T_{U3}$ and $T_{U4}$ may be positioned in a lateral arrangement (LA) extending in the second direction D2 with its respective capacitor among the capacitors $C_{L1}$, $C_{L2}$, $C_{L3}$, $C_{L4}$, $C_{U1}$, $C_{U2}$, $C_{U3}$ and $C_{U4}$. Each of the capacitors $C_{L1}$, $C_{L2}$, $C_{L3}$, $C_{L4}$, $C_{U1}$, $C_{U2}$, $C_{U3}$ and $C_{U4}$ may be positioned between its respective transistor among the transistors $T_{L1}$, $T_{L2}$, $T_{L3}$, $T_{L4}$, $T_{U1}$, $T_{U2}$, $T_{U3}$ and $T_{U4}$ and the plate line $PL_1$.

Referring to FIGS. 1, 2 and 3, a mirror-like structure 100A sharing a plate line is described.

The memory cell $MC_{L1}$ may include the transistor $T_{L1}$ and the capacitor $C_{L1}$. One end of the transistor $T_{L1}$ may be coupled to the bit line $BL_1$ and the other end of the transistor $T_{L1}$ may be coupled to one end of the capacitor $C_{L1}$. The other end of the capacitor $C_{L1}$ may be coupled to the plate line $PL_1$. The memory cell $MC_{L2}$ may include the transistor $T_{L2}$ and the capacitor $C_{L2}$. One end of the transistor $T_{L2}$ may be coupled to the bit line $BL_2$ and the other end of the transistor $T_{L2}$ may be coupled to one end of the capacitor $C_{L2}$. The other end of the capacitor $C_{L2}$ may be coupled to the plate line $PL_1$. As described above, the memory cells $MC_{L1}$ and $MC_{L2}$ may be symmetrically disposed with reference to the plate line $PL_1$.

That is, the memory cells $MC_{L1}$ and $MC_{L2}$ may be arranged in a mirror-like structure sharing the plate line $PL_1$ while being coupled to different bit lines $BL_1$ and $BL_2$. The memory cells $MC_{L1}$ and $MC_{L2}$ may be laterally arranged in the second direction D2 which is parallel to the plane CP.

Likewise, the memory cells $MC_{L3}$ and $MC_{L4}$ may be arranged in a mirror-like structure sharing the plate line $PL_1$ while being coupled to different bit lines $BL_3$ and $BL_4$. The memory cells $MC_{L3}$ and $MC_{L4}$ may be laterally arranged in the second direction D2 which is parallel to the plane CP.

The memory cells $MC_{U1}$ and $MC_{U2}$ may be arranged in a mirror-like structure sharing the plate line $PL_1$ while being coupled to different bit lines $BL_1$ and $BL_2$. The memory cells $MC_{U1}$ and $MC_{U2}$ may be laterally arranged in the second direction D2 which is parallel to the plane CP.

The memory cells $MC_{U3}$ and $MC_{U4}$ may be arranged in a mirror-like structure sharing the plate line $PL_1$ while being coupled to different bit lines $BL_3$ and $BL_4$. The memory cells $MC_{U3}$ and $MC_{U4}$ may be laterally arranged in the second direction D2 which is parallel to the plane CP.

Referring to FIGS. 1 and 4, a mirror-like structure 100B sharing a bit line is described.

The memory cell $MC_{L2}$ may include the transistor $T_{L2}$ and the capacitor $C_{L2}$. One end of the transistor $T_{L2}$ may be coupled to the bit line $BL_2$ and the other end of the transistor $T_{L2}$ may be coupled to one end of the capacitor $C_{L2}$. The other end of the capacitor $C_{L2}$ may be coupled to the plate line $PL_1$. The memory cell $MC_{L5}$ may include the transistor $T_{L5}$ and the capacitor $C_{L5}$. One end of the transistor $T_{L5}$ may be coupled to the bit line $BL_2$ and the other end of the transistor $T_{L5}$ may be coupled to one end of the capacitor $C_{L5}$. The other end of the capacitor $C_{L5}$ may be coupled to the plate line $PL_2$. As described above, the memory cells $MC_{L2}$ and $MC_{L5}$ are symmetrically disposed with reference to the bit line $BL_2$.

That is, the memory cells $MC_{L2}$ and $MC_{L5}$ may be arranged in a mirror-like structure sharing the bit line $BL_2$ while being coupled to different plate lines $PL_1$ and $PL_2$. The memory cells $MC_{L2}$ and $MC_{L5}$ may be laterally arranged in the second direction D2 which is parallel to the plane CP.

The memory cells $MC_{L4}$ and $MC_{L6}$ may be arranged in a mirror-like structure sharing the bit line $BL_4$ while being coupled to different plate lines $PL_1$ and $PL_2$. The memory cells $MC_{L4}$ and $MC_{L6}$ may be laterally arranged in the second direction D2 which is parallel to the plane CP.

The memory cells $MC_{U2}$ and $MC_{U6}$ may be arranged in a mirror-like structure sharing the bit line $BL_2$ while being coupled to different plate lines $PL_1$ and $PL_2$. The memory cells $MC_{U2}$ and $MC_{U6}$ may be laterally arranged in the second direction D2 which is parallel to the plane CP.

The memory cells $MC_{U4}$ and $MC_{U6}$ may be arranged in a mirror-like structure sharing the bit line $BL_4$ while being coupled to different plate lines $PL_1$ and $PL_2$. The memory cells $MC_{U4}$ and $MC_{U6}$ may be laterally arranged in the second direction D2 which is parallel to the plane CP.

The memory device 100 shown in FIG. 1 may include both of the mirror-like structure 100A sharing a plate line and the mirror-like structure 100B sharing a bit line.

FIG. 5 is a cross-sectional view illustrating a portion of the memory device 100 of FIG. 1, illustrating memory cells coupled to the bit lines $BL_1$ and $BL_2$ and the plate lines $PL_1$ and $PL_2$.

Referring to FIGS. 1 to 5, the memory device 100 may include a memory cell array stack MCA which is positioned above the peripheral structure 110, and the memory cell array stack MCA may include a lower memory cell array $MCA_L$ and an upper memory cell array $MCA_U$ that are vertically stacked. The memory device 100 may include bit lines $BL_1$ and $BL_2$ and plate lines $PL_1$ and $PL_2$ that are spaced apart from each other and vertically oriented relatively to the peripheral structure 110.

The memory cells $MC_{L1}$ and $MC_{U1}$ including transistors $T_{L1}$ and $T_{U1}$ and capacitors $C_{L1}$ and $C_{U1}$, respectively, may be formed between the bit line $BL_1$ and the plate line $PL_1$. Also, the memory cells $MC_{L2}$ and $MC_{U2}$ including transistors $T_{L2}$ and $T_{U2}$ and capacitors $C_{L2}$ and $C_{U2}$ respectively. The memory cells $MC_{L5}$ and $MC_{U5}$ including transistors $T_{L5}$ and $T_{U5}$ and capacitors $C_{L5}$ and $C_{U5}$ respectively, may be formed between the bit line $BL_2$ and the plate line $PL_2$. The memory cells $MC_{L1}$, $MC_{L2}$, and $MC_{L5}$ may be positioned at the same level in relation to the first direction D1 and in a lateral arrangement spaced apart from each other along the second direction D2. The memory cells $MC_{U1}$, $MC_{U2}$, and $MC_{U5}$ may be positioned at the same level in relation to the first direction D1 and in a lateral arrangement spaced apart from each other along the second direction D2. The transistor and capacitor forming each memory cell may be arranged laterally to each other along the second direction D2.

Each of the transistors $T_{L1}$, $T_{L2}$, $T_{L5}$, $T_{U1}$, $T_{U2}$ and $T_{U5}$ may include an active layer ACT which is laterally oriented with respect to the peripheral structure 110, and the active layer ACT may include a first source/drain region T1, a channel CH, and a second source/drain region T2. The first source/drain region T1, the channel CH, and the second source/drain region T2 may be positioned in a lateral arrangement along the second direction D2 which is parallel to the peripheral structure 110. The transistors $T_{L1}$, $T_{L2}$, $T_{L5}$, $T_{U1}$, $T_{U2}$ and $T_{U5}$ may include word lines $WL_{L1}$, $WL_{L2}$, $WL_{L5}$, $WL_{U1}$, $WL_{U2}$ and $WL_{U5}$, respectively, and the word lines $WL_{L1}$, $WL_{L2}$, $WL_{L5}$, $WL_{U1}$, $WL_{U2}$ and $WL_{U5}$ may be in a line shape extending so as to intersect with the active layer ACT. As illustrated in FIG. 5, the word lines $WL_{L1}$, $WL_{L2}$, $WL_{L5}$, $WL_{U1}$, $WL_{U2}$ and $WL_{U5}$ may be of a double word line structure in which the word lines are vertically stacked with the active layer ACT between them. Each of the word lines $WL_{L1}$, $WL_{L2}$, $WL_{L5}$, $WL_{U1}$, $WL_{U2}$ and $WL_{U5}$ may be composed of two conductive layers with the active layer ACT therebetween. A gate dielectric layer GD may be formed between each of the word lines $WL_{L1}$, $WL_{L2}$, $WL_{L5}$, $WL_{U1}$, $WL_{U2}$ and $WL_{U5}$ and the corresponding active layer ACT.

The capacitors $C_{L1}$, $C_{L2}$, $C_{L5}$, $C_{U1}$, $C_{U2}$ and $C_{U5}$ may each include a first node N1, a second node N2, and a dielectric material N3 between the first node N1 and the second node N2. The first node N1, the dielectric material N3, and the second node N2 may be positioned in a lateral arrangement which is parallel to the peripheral structure 110. According to the cross-sectional view of FIG. 5, each first node N1 may have a square bracket shape facing towards a respective plate line. Specifically, each first node N1 of the capacitors $C_{L1}$, $C_{L2}$, $C_{U1}$, and $C_{U2}$ may have a square bracket shape ("[" or "]" facing towards the plate line $PL_1$ and each first node N1 of the capacitors $C_{L5}$ and $C_{U5}$ may have a square bracket shape facing towards the plate line $PL_2$. Stated otherwise the first node N1 may have a cylinder shape with ono end of the cylinder being open. The horizontal parts of the bracket shape extending in the second direction D2 of each of the first nodes N1 may be longer than the part extending in the first direction D1 as illustrated in FIG. 5. The dielectric material N3 may be formed conformally within the interior surface of each first node N1 to leave a central region within each first node N1 to be filled with the second node N2. The second node N2 may extend from the respective plate line $PL_1$ or $PL_2$ to fill the inside of the central region of the first node N1. The dielectric material N3 may be disposed between each pair of first and second nodes N1 and N2.

Dielectric materials ILD may be formed between the lower memory cells $MC_{L1}$, $MC_{L2}$ and $MC_{L5}$ and the upper memory cells $MC_{U1}$, $MC_{U2}$ and $MC_{U5}$ that are vertically stacked. Thus, in the memory cell array stack MCA, the dielectric materials ILD may be positioned between the lower memory cell array $MCA_L$ and the upper memory cell array $MCA_U$. When a plurality of memory cell arrays are stacked, the lower memory cell arrays $MCA_L$, the dielectric materials ILD, and the upper memory cell arrays $MCA_U$ may be alternately stacked vertically.

FIG. 6 is a plan view illustrating the lower memory cell array $MCA_L$ of the memory cell array stack MCA.

Referring to FIGS. 1 to 6, the lower memory cell array $MCA_L$ may include bit lines $BL_1$, $BL_2$, $BL_3$ and $BL_4$ and plate lines $PL_1$ and $PL_2$. The bit lines $BL_1$, $BL_2$, $BL_3$ and $BL_4$ and the plate lines $PL_1$ and $PL_2$ may be vertically oriented from the peripheral structure 110, individually. The bit lines $BL_1$, $BL_2$, $BL_3$ and $BL_4$ and the plate lines $PL_1$ and $PL_2$ may be spaced apart from each other.

A memory cell $MC_{L1}$ including a transistor $T_{L1}$ and a capacitor $C_{L1}$ that are positioned in a lateral arrangement (LA) between the bit line $BL_1$ and the plate line $PL_1$ may be formed. A memory cell $MC_{L3}$ including a transistor $T_{L3}$ and a capacitor $C_{L3}$ that are positioned in a lateral arrangement (LA) between the bit line $BL_3$ and the plate line $PL_1$ may be formed. A memory cell $MC_{L2}$ including a transistor $T_{L2}$ and a capacitor $C_{L2}$ that are positioned in a lateral arrangement (LA) between the bit line $BL_2$ and the plate line $PL_1$ may be formed. A memory cell $MC_{L4}$ including a transistor $T_{L4}$ and a capacitor $C_{L4}$ that are positioned in a lateral arrangement (LA) between the bit line $BL_4$ and the plate line $PL_1$ may be formed.

A memory cell $MC_{L5}$ including a transistor $T_{L5}$ and a capacitor $C_{L5}$ that are positioned in a lateral arrangement (LA) between the bit line $BL_2$ and the plate line $PL_2$ may be formed. A memory cell $MC_{L6}$ including a transistor $T_{L6}$ and a capacitor $C_{L6}$ that are positioned in a lateral arrangement (LA) between the bit line $BL_4$ and the plate line $PL_2$ may be formed.

Each of the transistors $T_{L1}$, $T_{L2}$, $T_{L3}$, $T_{L4}$, $T_{L5}$ and $T_{L6}$ may include an active layer ACT which is laterally oriented with respect to the peripheral structure 110, and the active layer ACT may include a first source/drain region T1, a channel CH, and a second source/drain region T2. The first source/drain region T1, the channel CH, and the second source/drain region T2 may be positioned in a lateral arrangement LA which is parallel to the peripheral structure 110. The transistors $T_{L1}$, $T_{L2}$, may include the word line $WL_{L1}$, the transistors $T_{L3}$, $T_{L4}$, may include the word line $WL_{L2}$ and the transistors $T_{L5}$ and $T_{L6}$ may include the word line $WL_{L3}$. The word lines $WL_{L1}$, $WL_{L2}$ and $WL_{L3}$ may each have a shape of a line that extends in the third direction D3. The word lines $WL_{L1}$, $WL_{L2}$ and $WL_{L3}$ may each have a shape of a line that extends in the third direction D3 to overlap with the active region ACT of the channel CH of respective transistors. Specifically, the word line $WL_{L1}$, may overlap with the active region ACT of the channel CH of transistors $T_{L1}$ and $T_{L3}$, the word lines $WL_{L2}$, may overlap with the active region ACT of the channel CH of transistors $T_{L2}$ and $T_{L4}$, and the word line $WL_{L3}$, may overlap with the active region ACT of the channel CH of transistors $T_{L5}$ and $T_{L6}$. The word lines $WL_{L1}$, $WL_{L2}$ and $WL_{L3}$ may have a double word line structure in which the word lines $WL_{L1}$, $WL_{L2}$ and $WL_{L3}$ are vertically stacked with the respective active layers ACT between them. The transistors $T_{L1}$ and $T_{L3}$ may each be commonly coupled with word line $WL_{L1}$, the transistors $T_{L2}$ and $T_{L4}$ may each be commonly coupled with word line $WL_{L2}$, and the transistors $T_{L5}$ and $T_{L6}$ may each be commonly coupled with word line $WL_{L3}$.

The capacitors $C_{L1}$, $C_{L2}$, $C_{L3}$, $C_{L4}$, $C_{L5}$ and $C_{L6}$ may each include the first node N1, the second node N2, and the dielectric material N3 between the first node N1 and the second node N2. According to the view of FIG. 6, each first node N1 may have a square bracket shape facing towards a respective plate line. Specifically, each first node N1 of the capacitors $C_{L1}$, $C_{L2}$, $C_{L3}$, and $C_{L4}$ may have a square bracket shape ("[" or "]" facing towards the plate line PL1 and each first node N1 of the capacitors $C_{L5}$ and $C_{L6}$ may have a square bracket shape facing towards the plate line PL2. The horizontal parts of the bracket shape extending in the second direction D2 of each of the first nodes N1 may be longer than the part extending in the third direction D3 as illustrated in FIG. 6. The dielectric material N3 may be formed conformally within the interior surface of each first node N1 to leave a central region within each first node N1 to be filled with the second node N2. The second node N2 may extend from the respective plate line $PL_1$ or $PL_2$ to fill the inside of the central region of the first node N1. The dielectric material N3 may be disposed between each pair of first and second nodes N1 and N2.

Figure 7:
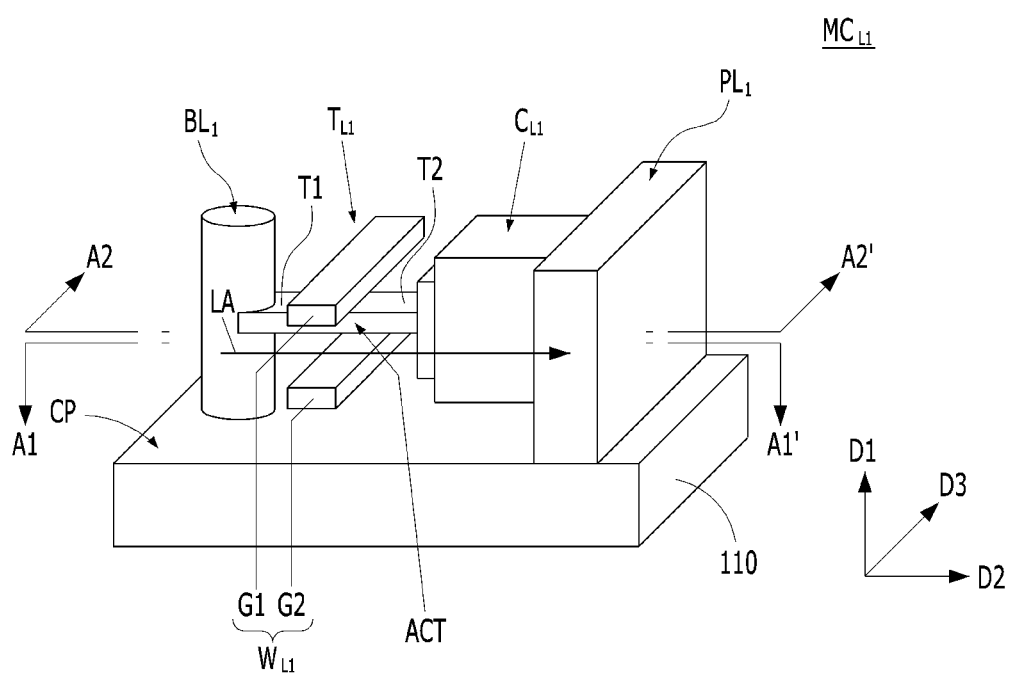
FIG. 7 is a perspective view showing details of a memory cell.
Figure 8:
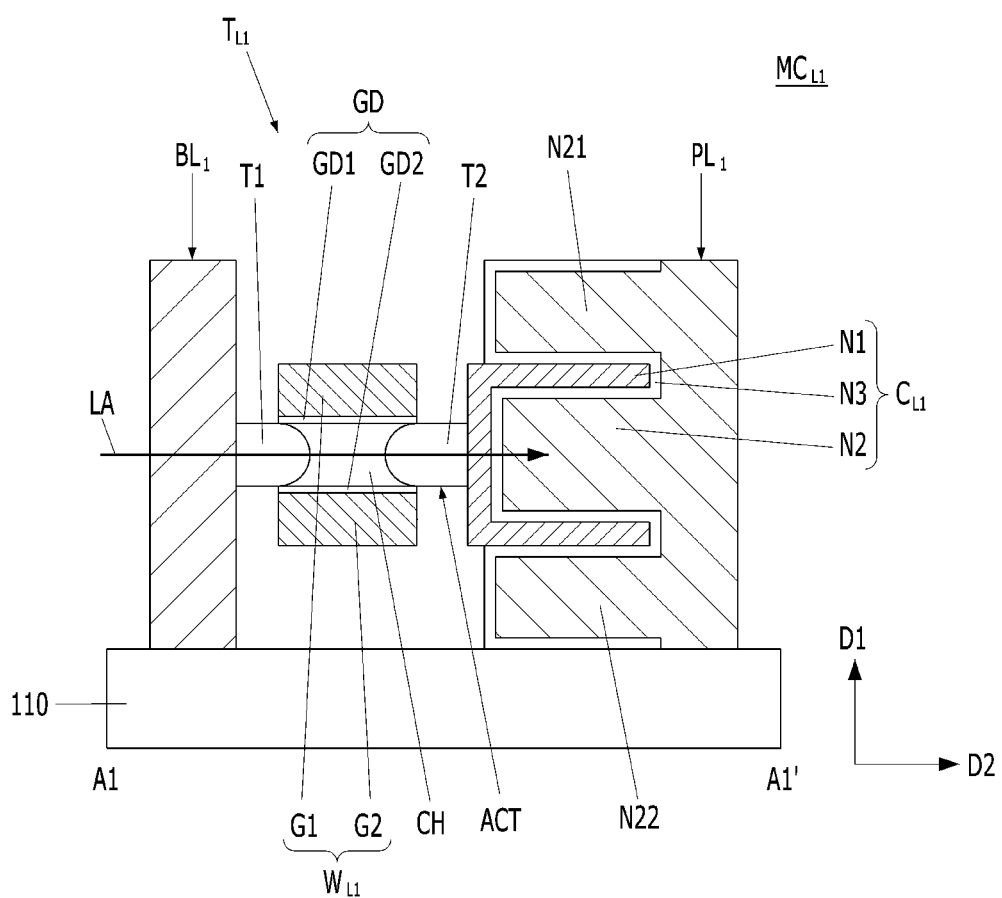
FIG. 8 is a cross-sectional view taken in a direction A1-A1' of FIG. 7.
Figure 9:
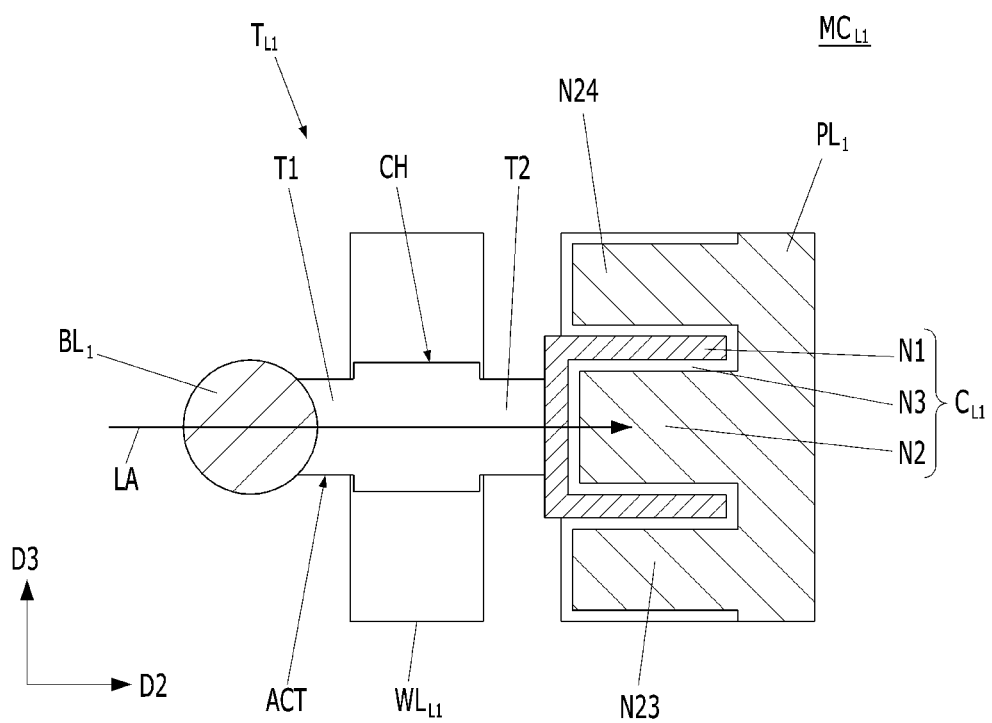
FIG. 9 is a plan view taken in a line A2-A2' of FIG. 7.
Figure 10:
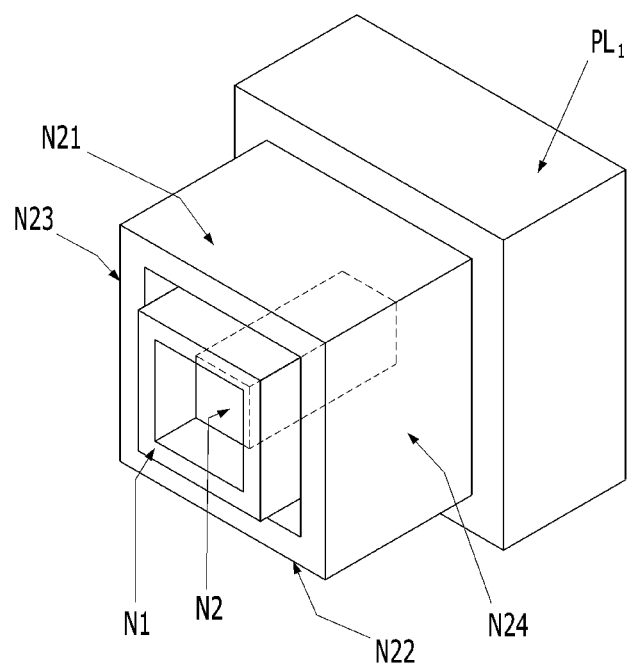
FIG. 10 is a detailed perspective view of a capacitor.

FIG. 7 is a perspective view showing details of a memory cell. FIG. 8 is a cross-sectional view taken in a line A1-A1' of FIG. 7. FIG. 9 is a plan view taken in a line A2-A2' of FIG. 7. FIG. 10 is a detailed perspective view of a capacitor. FIGS. 7 to 10 illustrate the memory cell $MC_{L1}$.

Referring to FIGS. 7 to 10, the memory cell $MC_{L1}$ may be positioned in a lateral arrangement (LA) in the second direction D2 which is parallel to the plane CP of the peripheral structure 110 between the bit line $BL_1$ and the plate line $PL_1$.

The memory cell $MC_{L1}$ may include a transistor $T_{L1}$ and a capacitor $C_{L1}$. The transistor $T_{L1}$ and the capacitor $C_{L1}$ may be positioned in a lateral arrangement (LA) extending in the second direction D2 which is parallel to the plane CP of the peripheral structure 110.

The transistor $T_{L1}$ may include an active layer ACT, a gate dielectric layer GD, and a word line $WL_{L1}$. The word line $WL_{L1}$ may include an upper word line G1 and a lower word line G2. That is, the word line $WL_{L1}$ may have the double word line structure in which the upper and lower word lines G1 and G2 are stacked with the active layer ACT therebetween.

The active layer ACT may include a first source/drain region T1 coupled to the bit line $BL_1$, a second source/drain region T2 coupled to the capacitor $C_{L1}$, and a channel CH positioned between the first source/drain region T1 and the second source/drain region T2. The active layer ACT may be laterally oriented in the second direction D2 between the bit line $BL_1$ and the capacitor $CL_1$. The active layer ACT may have the shape of an elongated flat plate. The first source/drain region T1, the channel CH, and the second source/drain region T2 may be positioned in a lateral arrangement LA which is oriented in the second direction D2 which is parallel to the plane CP. The first source/drain region T1, the second source/drain region T2, and the channel CH may be formed in the active layer ACT. The active layer ACT may be formed to include any suitable semiconductor material. For example, the active layer ACT may include doped polysilicon, undoped polysilicon, or amorphous silicon. The first source/drain region T1 and the second source/drain region T2 may be doped with an N-type impurity or a P-type impurity. The first source/drain region T1 and the second source/drain region T2 may be doped with an impurity of the same conductivity type. The first source/drain region T1 and the second source/drain region T2 may include at least one impurity selected from a group including arsenic (As), phosphorus (P), boron (B), indium (In), and combinations thereof. In some embodiments of the present invention, the channel CH may be doped with a conductive impurity. Referring to FIG. 9, the width of the channel CH along the third direction D3 may be greater than the width of the first and second source/drain regions T1 and T2.

The upper word line G1 and the lower word line G2 may form a single pair. The upper word line G1 and the lower word line G2 may be vertically stacked while spaced apart from each other in the first direction D1 with the channel CH interposed therebetween, and may be oriented along the third direction D3. The upper word line G1 and the lower word line G2 may be parallel to the plane CP, and extend along the third direction D3 which is parallel to the second direction D2. The upper word line G1 and the lower word line G2 may have a shape of lines extending along the third direction D3. The pair of the upper word line G1 and the lower word line G2 may form a vertically stacked double gate. The upper word line G1 and the lower word line G2 may include a silicon-based material, a metal-based material, or a combination thereof. The upper word line G1 and the lower word line G2 may include polysilicon, titanium nitride, tungsten, aluminum, copper, tungsten silicide, titanium silicide, nickel silicide, cobalt silicide or a combination thereof.

The upper word line G1 and the lower word line G2 may be set to the same potential, and one end of the upper word line G1 and one end of the lower word line G2 may be electrically connected to each other at an end of an array of units of mats or blocks of a plurality of memory cells. In an embodiment, the upper word line G1 and the lower word line G2 of the memory cells Mai may be connected to different nodes. The upper word line G1 may be connected to a node for applying a first voltage, and the lower word line G2 may be connected to another node applied with a second voltage. The first voltage and the second voltage are different from each other. For example, the upper word line G1 may be applied with a word line driving voltage, the lower word line G2 may be applied with a ground voltage. The upper word line G1 and the lower word line G2 may have the same width in the second direction D2 and the same length along the third direction D3. The upper word line G1 and the lower word line G2 may have the same thickness (dimension in the first direction D1). The upper word line G1, the lower word line G2, and the active layer ACT may have the same thickness or different thicknesses. Both-side edges of the upper word line G1 and both-side edges of the lower word line G2 may be aligned with each other. According to another embodiment of the present invention, both-side edges of the upper word line G1 and both-side edges of the lower word line G2 may not be aligned with each other. The upper word line G1 and the lower word line G2 may overlap with the channel CH of the active layer ACT in the first direction D1. The upper word line G1 and the lower word line G2 may partially cover the upper and lower portions of the active layer ACT. The upper word line G1 and the lower word line G2 may be formed of a material which is different from that of the active layer ACT. The upper word line G1 and the lower word line G2 may be paired. The word line resistance may be lowered because a pair of word lines including the upper word line G1 and the lower word line G2 is formed. In addition, since a pair of the upper word line G1 and the lower word line G2 are formed, interference between the memory cells that are vertically adjacent to each other may be prevented. For example, the lower word line G2 of the memory cell $MC_{U1}$ may be provided between the upper word line G1 of the memory cell $MC_{L1}$ and the upper word line G1 of the memory cell $MC_{U1}$. The lower word line G2 may be used to inhibit/prevent adjacent ones of the upper word lines G1 from being electrically coupled to each other.

The gate dielectric layer GD may be formed on the upper surface and the lower surface of the active layer ACT, individually. The gate dielectric layer GD may include a first dielectric portion GD1 and a second dielectric portion GD2. The first dielectric portion GD1 may be formed between the upper word line G1 and the channel CH, and the second dielectric portion GD2 may be formed between the lower word line G2 and the channel CH. The first dielectric portion GD1 may be discontinuous from the second dielectric portion GD2. The first dielectric portion GD1 and the second dielectric portion GD2 may have the same thickness and may be formed of the same material. The gate dielectric layer GD may include silicon oxide, silicon nitride, or a combination thereof. The gate dielectric layer GD may be formed by thermal oxidation of the active layer ACT. According to another embodiment of the present invention, the gate dielectric GD may include a high dielectric material, and the high dielectric material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). According to another embodiment of the present invention, the gate dielectric layer GD may include a stack of silicon oxide and a high dielectric material, the silicon oxide may be in direct contact with the channel CH, and the high dielectric material may be in direct contact with the upper word line G1 and the lower word line G2.

The capacitor $C_{L1}$ may include a first node N1 coupled to the transistor $T_{L1}$, a second node N2 coupled to the plate line $PL_1$, and a dielectric material N3 disposed between the first node N1 and the second node N2. The dielectric material N3 may form a continuous layer between the first node N1 and the second node N2. The first node N1, the dielectric material N3, and the second node N2 may be positioned in a lateral arrangement which is parallel to the plane CP.

The first node N1 of the capacitor $C_{L1}$ may have a three-dimensional structure. The first node N1 of the three-dimensional structure may be a lateral three-dimensional structure which is parallel to the plane CP. As an example of the three-dimensional structure, the first node N1 of the capacitor $C_{L1}$ may have a cylindrical shape, a pillar shape, or a pylinder shape (i.e., a merged form of a pillar shape and a cylindrical shape). The first node N1 may include polysilicon, metal, noble metal, a metal nitride, a conductive metal oxide, a conductive noble metal oxide, a metal carbide, a metal silicide, or a combination thereof. For example, the first node N1 may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a stack of titanium nitride and tungsten (TiN/W), or a stack of tungsten nitride and tungsten (WN/W).

The second node N2 of the capacitor $C_{L1}$ may have a branch shape extending in the second direction D2 which is parallel to the plane CP from the plate line $PL_1$. The dielectric material N3 may have a shape surrounding the second node N2 having a form of branch, and the first node N1 may have a shape surrounding the second node N2 with the dielectric material N3 interposed therebetween. For example, the first node N1 having a cylindrical shape may be electrically connected to the second source/drain region T2 of the transistor $T_{L1}$, and the second node N2 may be positioned in the inside of the cylindrical shape of the first node N1, and the second node N2 may be electrically connected to the plate line $PL_1$.

Referring to FIG. 10, the second node N2 of the capacitor $C_{L1}$ may further include outer second nodes N21, N22, N23 and N24 coupled to the plate line $PL_1$. The outer second nodes N21, N22, N23 and N24 may be positioned outside the first node N1 with the dielectric material N3 interposed therebetween. The second node N2 may be abbreviated as an 'inner second node', and the inner second node N2 may be positioned inside the cylindrical shape of the first node N1.

The outer second nodes N21, N22, N23 and N24 may be positioned to surround the outer wall of the cylindrical shape of the first node N1. The outer second nodes N21, N22, N23 and N24 may be in continuum with each other.

The capacitor $C_{L1}$ may include a metal-insulator-metal (MIM) capacitor. The first node N1 and the second nodes N2, N21, N22, N23 and N24 may include a metal-based material, and the dielectric material N3 may include silicon oxide, silicon nitride, or a combination thereof. The dielectric material N3 may include a high dielectric (high-k) material having a higher dielectric constant than that of silicon oxide ($SiO_2$) which has a dielectric constant of approximately 3.9. The dielectric material N3 may include a high dielectric material having a dielectric constant of approximately 4 or higher. The high dielectric material may have a dielectric constant of approximately 20 or more. The high dielectric material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). According to another embodiment of the present invention, the dielectric material N3 may be a composite layer including two or more layers of the aforementioned high-dielectric materials.

The first node N1 and the second nodes N2, N21, N22, N23 and N24 may include a metal, a noble metal, a metal nitride, a conductive metal oxide, a conductive noble metal oxide, a metal carbide, a metal silicide, or a combination thereof. For example, the first node N1 and the second nodes N2, N21, N22, N23 and N24 may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a stack of titanium nitride/tungsten (TiN/W), a stack of tungsten nitride/tungsten (WN/W). The first node N1 and the second nodes N2, N21 and N22 may include a combination of a metal-based material and a silicon-based material. For example, the second nodes N2, N21, N22, N23 and N24 may be a stack of titanium nitride/silicon germanium/tungsten nitride (TiN/SiGe/WN).

The dielectric material N3 may be formed of a zirconium-based oxide. The dielectric material N3 may have a stack structure including zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may be a structure in which aluminum oxide ($Al_2O_3$) is stacked over zirconium oxide ($ZrO_2$), and zirconium oxide ($ZrO_2$) may contact the first node N1, while aluminum oxide ($Al_2O_3$) may contact the second node N2. The ZAZ stack may be a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide-based layer. According to another embodiment of the present invention, the dielectric material N3 may be formed of a hafnium-based oxide. The dielectric material N3 may have a stack structure including hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may be a structure in which aluminum oxide ($Al_2O_3$) is stacked over hafnium oxide ($HfO_2$), and hafnium oxide ($HfO_2$) may contact the first node N1, and aluminum oxide ($Al_2O_3$) may contact the second node N2. The HAH stack may be a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide-based layer ($HfO_2$-based layer). In the ZA stack, the ZAZ stack, the HA stack, and the HAH stack, the aluminum oxide ($Al_2O_3$) may have a band gap energy which is larger than those of zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Thus, the dielectric material N3 may include a stack of a high dielectric material and a high-band gap energy material whose band gap energy is greater than the high dielectric material. The dielectric material N3 may include silicon oxide ($SiO_2$) as another high-band gap energy material other than aluminum oxide ($Al_2O_3$). The dielectric material N3 may include a high-band gap energy material so that the leakage current may be suppressed. The high-band gap energy material may be extremely thin. The high-band gap energy material may be thinner than the high dielectric material.

According to another embodiment of the present invention, the dielectric material N3 may have a laminated structure in which a high dielectric material and a high-band gap material are alternately stacked. For example, the dielectric material N3 may have ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$). In the laminated structure, the aluminum oxide ($Al_2O_3$) may be extremely thin.

According to another embodiment of the present invention, the dielectric material N3 may include a stack structure, a laminated structure or an inter-mixing structure including zirconium oxide, hafnium oxide, and aluminum oxide.

According to another embodiment of the present invention, an interface controlling layer may be further formed to improve the leakage current between the first node N1 and the dielectric material N3. The interface controlling layer may include titanium oxide ($TiO_2$). The interface controlling layer may be formed between the second node N2 and the dielectric material N3.

The bit line $BL_1$ and the plate line $PL_1$ may include a silicon-based material, a metal-base material or a combination thereof. The bit line $BL_1$ may include polysilicon, titanium nitride, tungsten, or a combination thereof. For example, the bit line $BL_1$ may include polysilicon doped with an N-type impurity or titanium nitride (TiN). The bit line $BL_1$ may include a stack of titanium nitride and tungsten (TiN/W). An ohmic contact such as a metal silicide may be further formed between the bit line $BL_1$ and the first source/ drain region T1 of the transistor $T_{L1}$. The plate line $PL_1$ may be formed of the same material as that of the second nodes N2, N21, N22, N23 and N24. The plate line $PL_1$ and the second nodes N2, N21, N22, N23 and N24 may be formed simultaneously.

The bit line $BL_1$ may have a form of a pillar vertically extending from the plane CP in the first direction D1. A cross-section of the bit line $BL_1$ taken in the second direction D2 may be circle-shaped or oval-shaped. The pillar-shaped bit line $BL_1$ may have a low resistance.

The plate line $PL_1$ may be a linear shape vertically extending from the plane CP in the first direction D1. The cross-sections of the plate line $PL_1$ in the first, second direction, and third directions D1, D2, and D3 may be rectangles of different areas. The plate line $PL_1$ may have a width (dimension in the second direction D2) that is smaller than its length (dimension in the third direction D3) and also smaller than its height (dimension in the first direction D1). More specifically, the width (dimension in the second direction D2) of the plate line $PL_1$ may be the same as the width (dimension in the second direction D2) of the word line WL1 as shown in FIG. 7. The height (dimension in the first direction D1) of the plate line $PL_1$ may be such that the top surface of the plate line $PL_1$ is positioned higher than a top surface of a node N1 of a capacitor (e.g., $C_{U2}$) of a top memory cell (e.g., $MC_{U2}$) of the upper memory cell array $MCA_U$. The length (dimension in the third direction D3) of the plate line $PL_1$ may be such that the plate line may be coextensive in the third direction with the word lines.

According to the above description, the upper word line G1 and the lower word line G2 may be formed to be laterally spaced apart from the bit line $BL_1$ and the plate line $PL_1$. Accordingly, the parasitic capacitance between the word line $WL_{L1}$ and the capacitor $C_{L1}$ may be decreased, and the parasitic capacitance between the word line $WL_{L1}$ and the bit line $BL_1$ may be reduced.

The method of forming the memory cell $MC_{L1}$ of FIGS. 7 to 10 may include a process of forming the transistor $T_{L1}$, a process of forming the bit line $BL_1$, a process of forming the capacitor $C_{L1}$, and a process of forming the plate line $PL_1$.

A process of forming the transistor $T_{L1}$ will now be described. An active layer ACT may be formed to be vertically (i.e., in the first direction D1) spaced apart from the plane CP of a top surface of the peripheral structure 110, and gate dielectric layers GD1 and GD2 may be formed on the upper and lower surfaces of the active layer ACT. Subsequently, the upper word line G1 and the lower word line G2 may be formed over the gate dielectric layers GD1 and GD2, respectively. Subsequently, the first source/drain region T1 and the second source/drain region T2 may be formed through ion implantation of an impurity into the active layer ACT.

The bit line $BL_1$ may be formed to be vertically oriented from the plane CP of the peripheral structure 110. The bit line $BL_1$ may be formed to be coupled to the first source/drain region T1.

The process of forming the capacitor $C_{L1}$ will now be described. First, a first node N1 may be formed to be coupled to the second source/drain region T2. Subsequently, a dielectric material N3 may be formed over the first node N1. Subsequently, a second node N2 may be formed over the dielectric material N3. A plate line $PL_1$ may be formed while the second node N2 is formed. The plate line $PL_1$ may be vertically oriented from the plane CP of the peripheral structure 110.

Figure 11A:
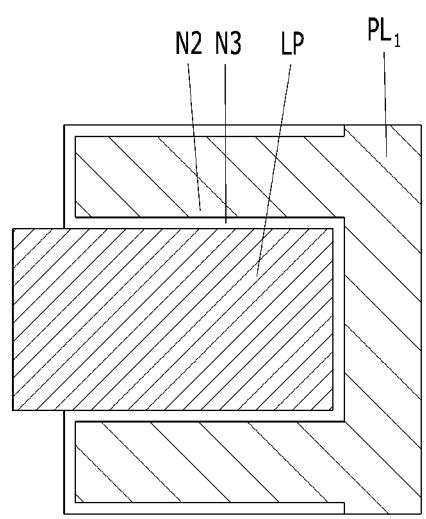
FIGS. 11A to 11C are views illustrating a first node of a capacitor having a three-dimensional structure in accordance with another embodiment of the present invention.
Figure 11B:
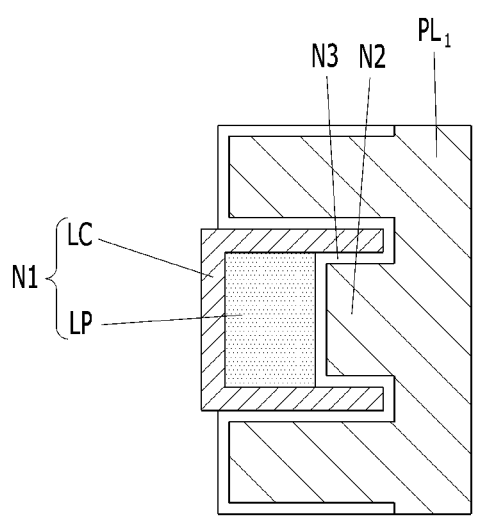
Figure 11C:
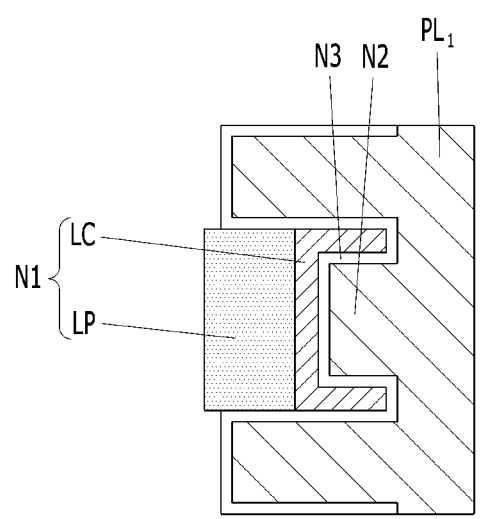

FIGS. 11A to 11C are views illustrating a first node of a capacitor having a three-dimensional structure in accordance with another embodiment of the present invention. FIG. 11A shows a pillar-shaped first node LP, and FIGS. 11B and 11C show a first node N1 having a form of a pylinder, i.e., a combination of a pillar and a cylinder structure.

Referring to FIG. 11A, the first node Ni may be a lateral pillar LP. A lateral pillar LP may include a metal-based material, a silicon-based material, or a combination thereof. For example, the lateral pillar LP may be formed of titanium nitride alone or may be formed of a stack of titanium nitride and polysilicon.

Referring to FIGS. 11B and 11C, the first node N1 having the form of a pylinder may include a lateral cylinder LC and a lateral pillar LP that are parallel to the plane CP. Referring to FIG. 11B, the lateral pillar LP may be positioned in the inside of the lateral cylinder LC. The lateral length of the lateral cylinder LC may be longer than the lateral length of the lateral pillar LP. For example, the inlet of the lateral cylinder LC may not be filled with the lateral pillar LP. Referring to FIG. 11C, the lateral cylinder LC may be formed in a lateral arrangement over the lateral pillar LP.

Referring to FIG. 11B, the lateral cylinder LC and the lateral pillar LP may be of the same material or different materials. The lateral cylinder LC and the lateral pillar LP may include a metal-based material, a silicon-based material, or a combination thereof. For example, the lateral cylinders LC may be titanium nitride, and the lateral pillar LP may be polysilicon.

Referring to FIG. 11C, the lateral cylinder LC and the lateral pillar LP may be of the same material or different materials. The lateral cylinder LC and the lateral pillar LP may include a metal-based material, a silicon-based material, or a combination thereof. For example, the lateral cylinder LC and the lateral pillar LP may be of titanium nitride. In addition, the lateral cylinder LC may be of titanium nitride and the lateral pillar LP may be of polysilicon.

Figure 12A:
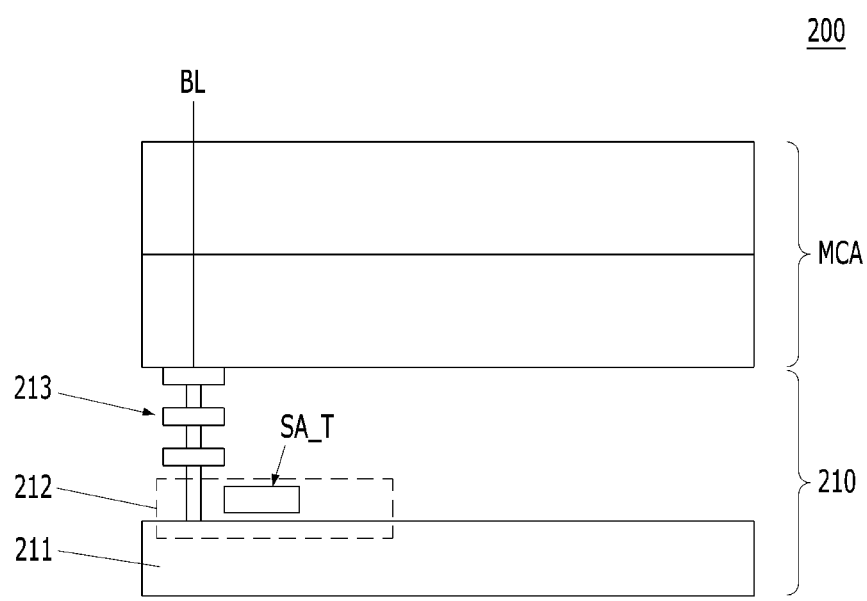
FIGS. 12A and 12B are views illustrating a memory device in accordance with another embodiment of the present invention.
Figure 12B:
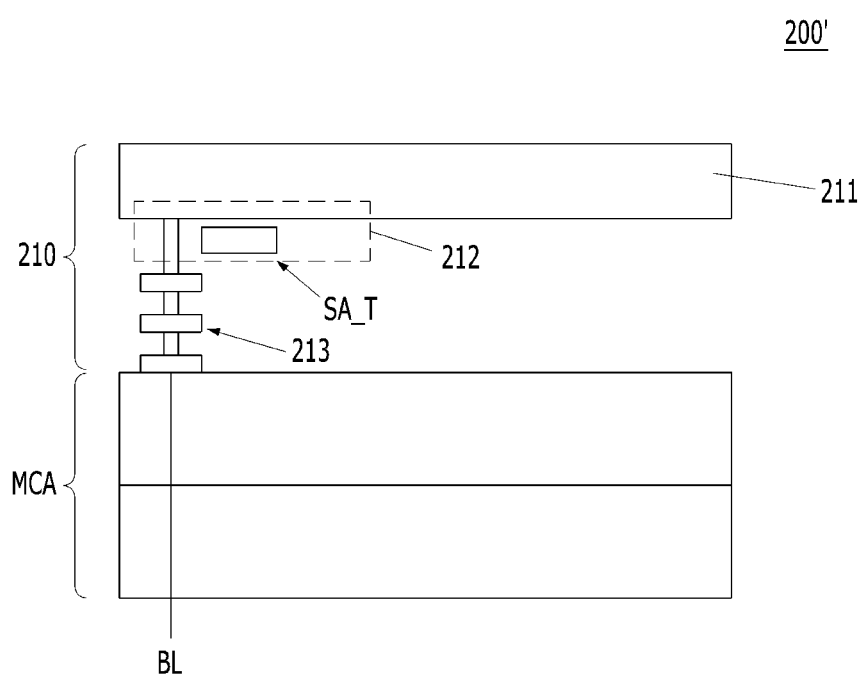

FIGS. 12A and 12B are views illustrating a memory device 200 and 200' in accordance with another embodiment of the present invention.

Referring to FIGS. 12A and 12B, the memory device 200 and 200' may include a peripheral circuit portion 210 and a memory cell array stack MCA. The memory cell array stack MCA may be the same as the memory cell array stack MCA of FIG. 1.

Referring to FIG. 12A, the memory cell array stack MCA may be positioned above the peripheral circuit portion 210. The peripheral circuit portion 210 may correspond to the peripheral structure 110 of FIG. 1. Accordingly, the memory device 200 may have a PUC (Peripheral Under Cell) structure.

Referring to FIG. 12B, the memory cell array stack MCA may be positioned below the peripheral circuit portion 210. The peripheral circuit portion 210 may correspond to the peripheral structure 110 of FIG. 1. For example, in FIG. 1, the peripheral structure 110 may be stacked above the memory cell array stack MCA. Thus, the memory device 200' may have a CUP (Cell under Peripheral) structure.

The peripheral circuit portion 210 may refer to a circuit for driving and controlling the memory cell array stack MCA during a driving operation (including a read or write operation) to a memory. The peripheral circuit portion 210 may include an N-channel transistor, a P-channel transistor, a CMOS circuit, or a combination thereof. The peripheral circuit portion 210 may include an address decoder circuit, a read circuit, and a write circuit.

The peripheral circuit portion 210 may have a structure including a semiconductor substrate 211 and a sense amplifier 212 arranged on the surfaces of the semiconductor substrate 211. The sense amplifier 212 may include a transistor SA_T using the semiconductor substrate 211 as a channel. The transistor SA_T may include a planar channel transistor whose channel is parallel to the surface of the semiconductor substrate 211. The transistor structure in the sense amplifier 211 may include a recess channel transistor, a buried gate transistor, and a fin channel transistor (FinFET) in addition to the planar channel transistor.

The bit lines BL of the memory cell array stack MCA may be electrically connected to the transistor SA_T of the sense amplifier 211. The bit lines BL and the transistor SA_T may be coupled to each other through a multi-level metal line MLM 213. The multi-level metal line MLM 213 may be formed by a Damascene process. It is understood that transistor SA_T is described as an example of a plurality of transistors which may be included in the peripheral circuit portion 210.

Although not illustrated, according to another embodiment of the present invention, the memory device 200 and 200' may include a first semiconductor substrate and a second semiconductor substrate bonded to the first semiconductor substrate. The memory cell array stack MCA may be formed over the first semiconductor substrate, and the peripheral circuit portion 210 may be formed over the second semiconductor substrate. Each of the first semiconductor substrate and the second semiconductor substrate may include conductive bonding pads, and the first semiconductor substrate and the second semiconductor substrate may be bonded to each other through the conductive bonding pads. Thus, the memory cell array stack MCA and the peripheral circuit portion 210 may be electrically connected to each other.

Figure 13:
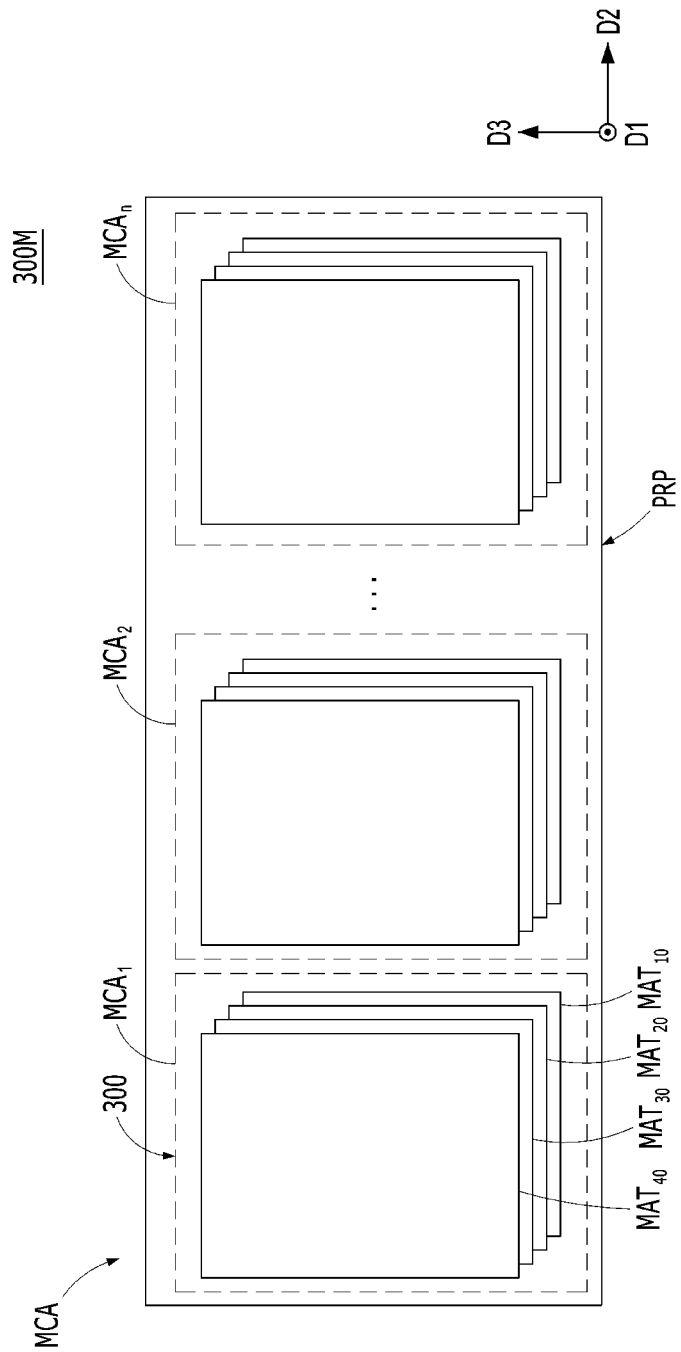
FIG. 13 is a perspective view illustrating a schematic structure of a memory device in accordance with another embodiment of the present invention.
Figure 14A:
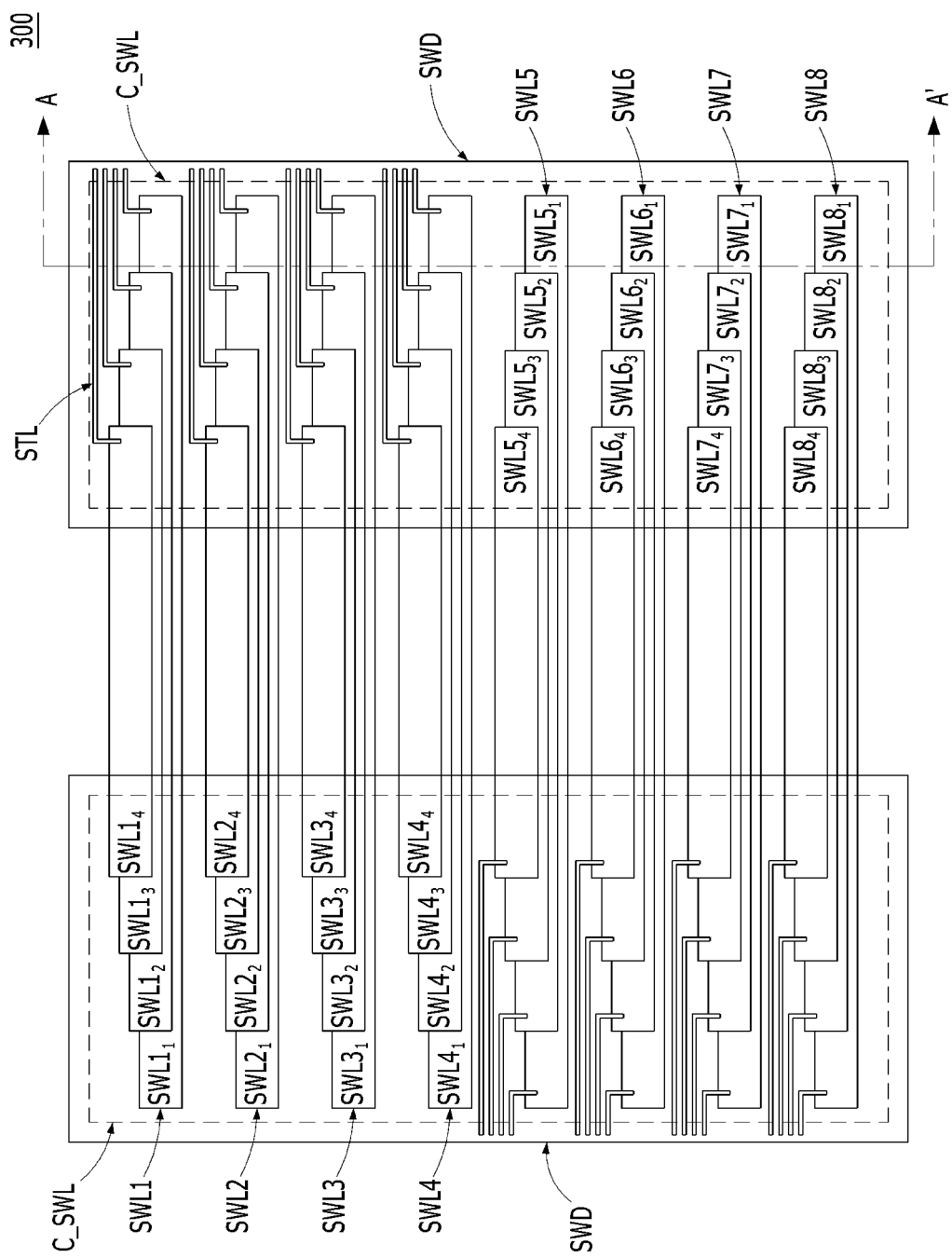
FIG. 14A is a view illustrating a portion 300 of FIG. 13.
Figure 14B:
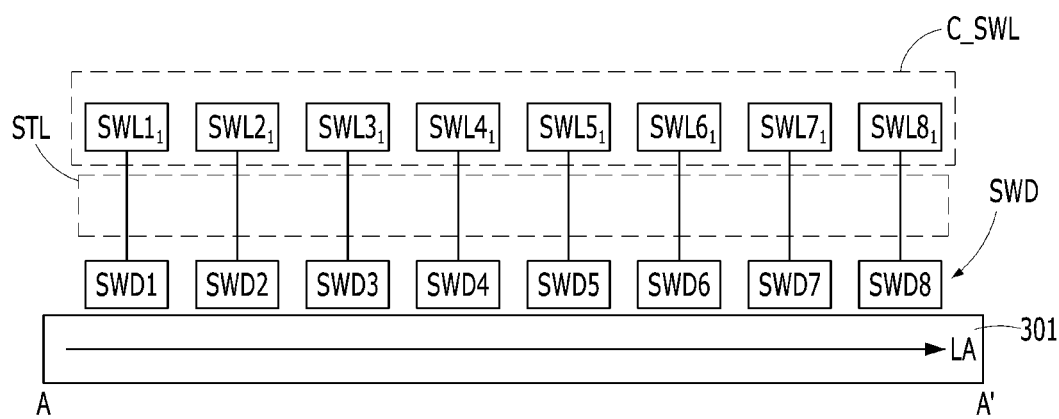
FIG. 14B is a cross-sectional view taken in a line A-A' of FIG. 14A.
Figure 15:
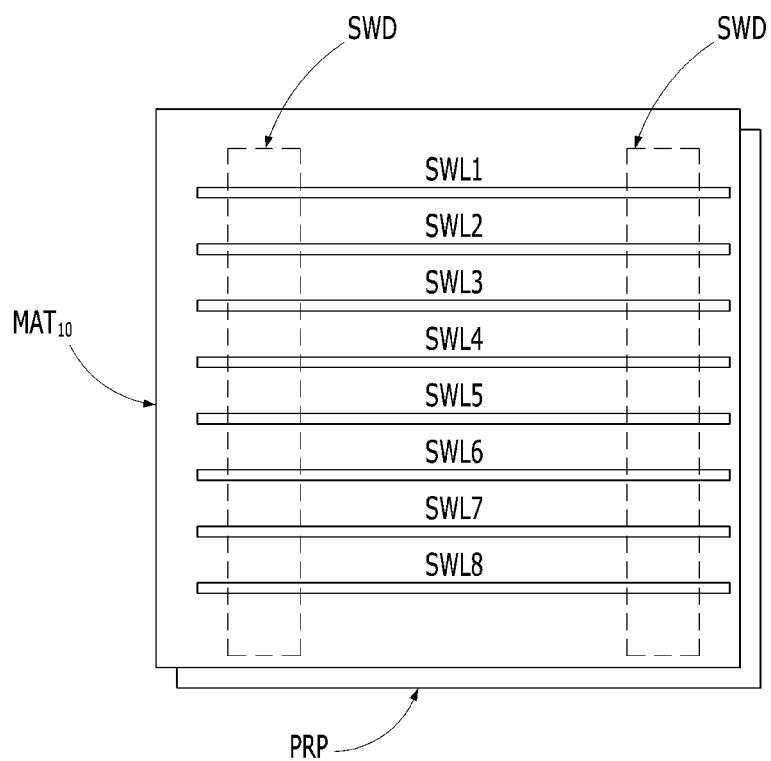
FIGS. 15 and 16 illustrate a connection relationship between one memory cell mat and a peripheral circuit portion.
Figure 16:
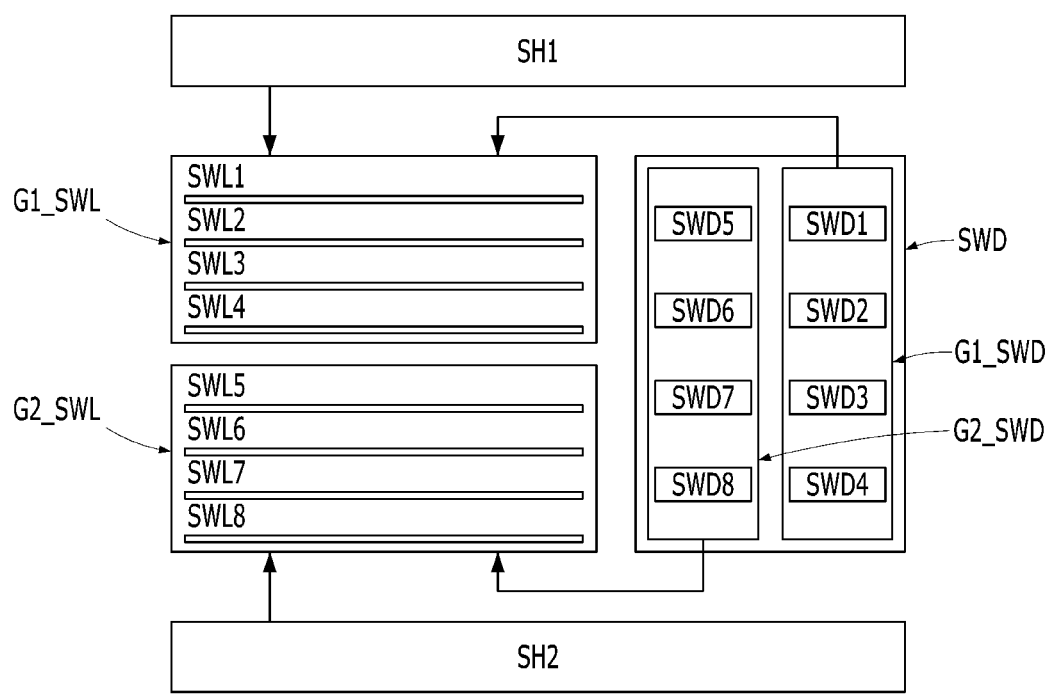

FIG. 13 is a perspective view illustrating a schematic structure of a memory device in accordance with another embodiment of the present invention. FIG. 14A is a view illustrating a portion 300 of FIG. 13. FIG. 14B is a cross-sectional view taken in a line A-A' of FIG. 14A. FIGS. 15 and 16 illustrate a connection relationship between one memory cell mat and a peripheral circuit portion. The memory device may include a plurality of memory cell mats, and the memory cell mats may be arranged in rows and columns.

Referring to FIG. 13, a memory device 300M may include a plurality of memory cell array stacks MCA1 to MCAn spaced apart at a regular interval along the second direction D2. Each of the memory cell array stacks $MCA_1$ to $MCA_n$ may include a plurality of memory cell mats $MAT_{10}$ to $MAT_{40}$. The memory cell mats $MAT_{10}$ to $MAT_{40}$ in each of the memory cell array stacks $MCA_1$ to $MCA_n$ may be stacked vertically in the first direction D1. Each of the memory cell mats $MAT_{10}$ to $MAT_{40}$ may be a memory cell array matrix, having a plurality of memory cells arranged in rows and columns along the second and third directions D2 and D3, respectively.

The memory cell mats MAT10 to MAT40 may be positioned above a peripheral circuit portion PRP.

The peripheral circuit portion PRP may be the peripheral circuit portion 210 described earlier. The peripheral circuit portion PRP may include at least one control circuit for controlling the operation of the memory cell array stacks $MCA1$ to $MCA_n$. The at least one control circuit may include a sense amplifier, a sub word line driver circuit SWD, a refresh circuit, a pre-charge circuit, a column address circuit, a row/column repair circuit, a row-column control circuit, a test mode circuit, a data driver circuit, or an analog circuit.

Each of the memory cell mats $MAT_{10}$ to $MAT_{40}$ may include a plurality of memory cells that are arranged at the same level (i.e., a horizontal level defined by the second and third directions D2 and D3). In an embodiment, the memory cells may be DRAM memory cells. The memory cells may have the structure described earlier. For example, as described in FIG. 1, each of the memory cells may include a bit line which is vertically oriented at a level higher than the peripheral circuit portion PRP, a plate line which is vertically oriented at a level higher than the peripheral circuit portion PRP, and a transistor and a capacitor between the bit line and the plate line, and word lines of a double structure which are vertically stacked with an active layer of the transistor interposed therebetween.

The word lines WL of the memory cell may be simply referred to as 'sub word line SWL'. The memory cell mat may be formed vertically from the peripheral circuit portion PRP.

FIG. 14A is a view illustrating the portion 300 of FIG. 13 and shows sub word line stacks SWL1 to SWL8 of the memory cell mats MAT10 to MAT40.

Referring to FIG. 14A, each of the memory cell mats MAT10 to MAT40 may include eight sub word line stacks SWL1 to SWL8. Accordingly, the stacked structure of the memory cell mats $MAT_{10}$ to MAT40 may be formed of vertically stacked sub word lines. For example, four sub word lines $SWL1_1$ to $SWL1_4$ may be vertically stacked in the first sub word line stack SWL1. Four sub word lines $SWL2_1$ to $SWL2_4$ may be vertically stacked in the second sub word line stack SWL2. Four sub word lines $SWL3_1$ to $SWL3_4$ may be vertically stacked in the third sub word line stack SWL3. Four sub word lines $SWL4_1$ to $SWL4_4$ may be vertically stacked in the fourth sub word line stack SWL4. Four sub word line stacks $SWL5_1$ to $SWL5_4$ may be vertically stacked in the fifth sub word line stack SWL5. Four sub word lines $SWL6_1$ to $SWL6_4$ may be vertically stacked in the sixth sub word line stack SWL6. Four sub word lines $SWL7_1$ to $SWL7_4$ may be vertically stacked in the seventh sub word line stack SWL7. Four sub word lines $SWL8_1$ to $SWL8_4$ may be vertically stacked in the eighth sub word line stack SWL8. As such, each of the sub word line stacks of the mat may have four layers.

In each sub word line stack, the height may be gradually increased (in a stepwise manner) from the lowest level sub word lines $SWL1_1$ to $SWL8_1$ to the highest level sub word lines $SWL1_4$ to $SWL8_4$. Eight sub word lines may be laterally arranged at the same level. For example, in FIG. 14A the first sub word lines $SWL1_1$, $SWL2_1$, $SWL3_1$, $SWL4_1$, $SWL5_1$, $SWL6_1$, $SWL7_1$, and $SWL8_1$ may be laterally arranged at the lowest level, and the fourth sub word lines $SWL1_4$, $SWL2_4$, $SWL3_4$, $SWL4_4$, $SWL5_4$, $SWL6_4$, $SWL7_4$, $SWL8_4$ may be laterally arranged at the highest level. The length of the sub word lines which are positioned at the same layer may be the same. The length of the sub word lines may decrease in a stepwise manner from the lowest level to the highest level creating multi-step end structures. As illustrated in FIG. 14A the multi step end structures may be formed at both opposite ends of the mat along the second direction D2 which symmetrical with respect to an axis of symmetry extending in the third direction D3 and crossing through a center point of the mat.

One-side end of each sub word line stack may be simply referred to as a word line contact region C_SWL. The word line contact region C_SWL may include the multi-step end structures of all the sub word line stacks. Hence, in the embodiment of FIG. 14A, there may be a left and a right word line contact region C_SWL corresponding to the opposite side step end structures of the mat. The sub word line driver circuit SWD may be positioned underneath the word line contact region C_SWL. Each of the sub word lines $SWL1_1$ to $SWL8_1$ may be electrically connected to the sub word line driver circuit SWD through an interconnection STL.

Referring to FIG. 14B, a sub word line driver circuit SWD may be formed over the substrate 301. The sub word line driver circuit SWD may include a plurality of sub word line drivers SWD1 to SWD8. The sub word line drivers SWD1 to SWD8 may be coupled to a corresponding one of the sub word lines $SWL1_1$ to $SWL8_1$ through a corresponding one of the interconnections STL.

The sub word lines $SWL1_1$ to $SWL8_1$ may be laterally arranged at a same level (see reference numeral 'LA'). The sub word lines $SWL1_1$ to $SWL8_1$ may be disposed over the sub word line drivers SWD1 to SWD8. The sub word line stacks SWL1 to SWL8 may be vertically arranged above the sub word line drivers SWD1 to SWD8, i.e., the $SWL1_1$ above the SWD1, the $SWL2_1$ above the SWD2, the $SWL3_1$ above the SWD3, the $SWL4_1$ above the SWD4, the $SWL5_1$ above the SWD5, the $SWL6_1$ above the SWD6, the $SWL7_1$ above the SWD7, and the $SWL8_1$ above the SWD8.

FIG. 15 is a detailed view illustrating one memory cell mat e.g., $MAT_{10}$ and a peripheral circuit portion PRP corresponding to the memory cell mat $MAT_{10}$.

Referring to FIG. 15, the memory cell mat $MAT_{10}$ may include a plurality of sub word lines arranged in stacks. For example, the memory cell mat $MAT_{10}$ may include eight sub word line stacks SWL1 to SWL8. The sub word line stacks SWL1 to SWL8 may each include a plurality of sub word lines having a double word line structure, for example the double word line structure of FIG. 5. Hereinafter, for the sake of convenience in description, the sub word lines in the sub word line stacks SWL1 to SWL8 are illustrated as single sub word lines.

The peripheral circuit portion PRP may include a sub word line driver circuit SWD. The sub word line driver circuit SWD may be disposed underneath the memory cell mat MAT. For example, the sub word line driver circuit SWD may be disposed underneath both-side ends of the memory cell mat $MAT_{10}$.

Hereinafter, for the sake of convenience in description, the sub word line driver circuit SWD is illustrated only on the right side of the memory cell mat $MAT_{10}$.

FIG. 16 illustrates a connection relationship between one memory cell mat and a peripheral circuit portion. The connection relationship between the sub word lines and the sub word line driver is described by taking an example of the lowest level sub word lines $SWL1_1$ to $SWL8_1$. Hereinafter, for the sake of convenience in description, the lowest level sub word lines are denoted by 'SWL1 to SWL8'.

Referring to FIG. 16, the sub word lines SWL1 to SWL8 may be defined as first and second sub word line groups G1_SWL and sub word line group G2_SWL. The first sub word line group G1_SWL may include four sub word lines SWL1 to SWL4, and the second sub word line group G2_SWL may include four sub word lines SWL5 to SWL8. According to another embodiment of the present invention, the first sub word line group G1_SWL may include odd sub word lines Odd SWL, which are SWL1, SWL3, SWL5, and SWL7, and the second sub word line group G2_SWL may include even sub word lines Even SWL, which are SWL2, SWL4, SWL6, and SWL8.

The peripheral circuit portion PRP may include at least one or more control circuits. The peripheral circuit portion PRP may include a plurality of sub word line driver circuits SWD. Each of the sub word line driver circuits SWD may include a first and a second sub word line driver circuit group G1_SWD and G2_SWD. The first sub word line driver circuit group G1_SWD may be a circuit for controlling the first sub word line group G1_SWL. The second sub word line driver circuit group G2_SWD may be a circuit for controlling the second sub word line group G2_SWL.

The first sub word line driver circuit group G1_SWD may include a plurality of sub word line drivers SWD1 to SWD4 for driving the sub word lines SWL1 to SWL4. The second sub word line driver circuit group G1_SWD may include a plurality of sub word line drivers SWD5 to SWD8 for driving the sub word lines SWL5 to SWL8. For example, the first to fourth sub word lines SWL1 to SWL4 may be driven by the first to fourth sub word line drivers SWD1 to SWD4, respectively. The fifth to eighth sub word lines SWL5 to SWL8 may be driven by the fifth to eighth sub word line drivers SWD5 to SWD8, respectively.

The peripheral circuit portion PRP may further include a plurality of sub-hole circuits SH1 to SH2. The sub-hole circuits SH1 to SH2 may be circuits for controlling the first and second sub word line driver groups G1_SWD and G2_SWD. The sub-hole circuits SH1 to SH2 may be disposed underneath the memory cell mat MAT. The sub-hole circuits SH1 to SH2 may be disposed along two opposite sides of the cell mat MAT.

Figure 17:
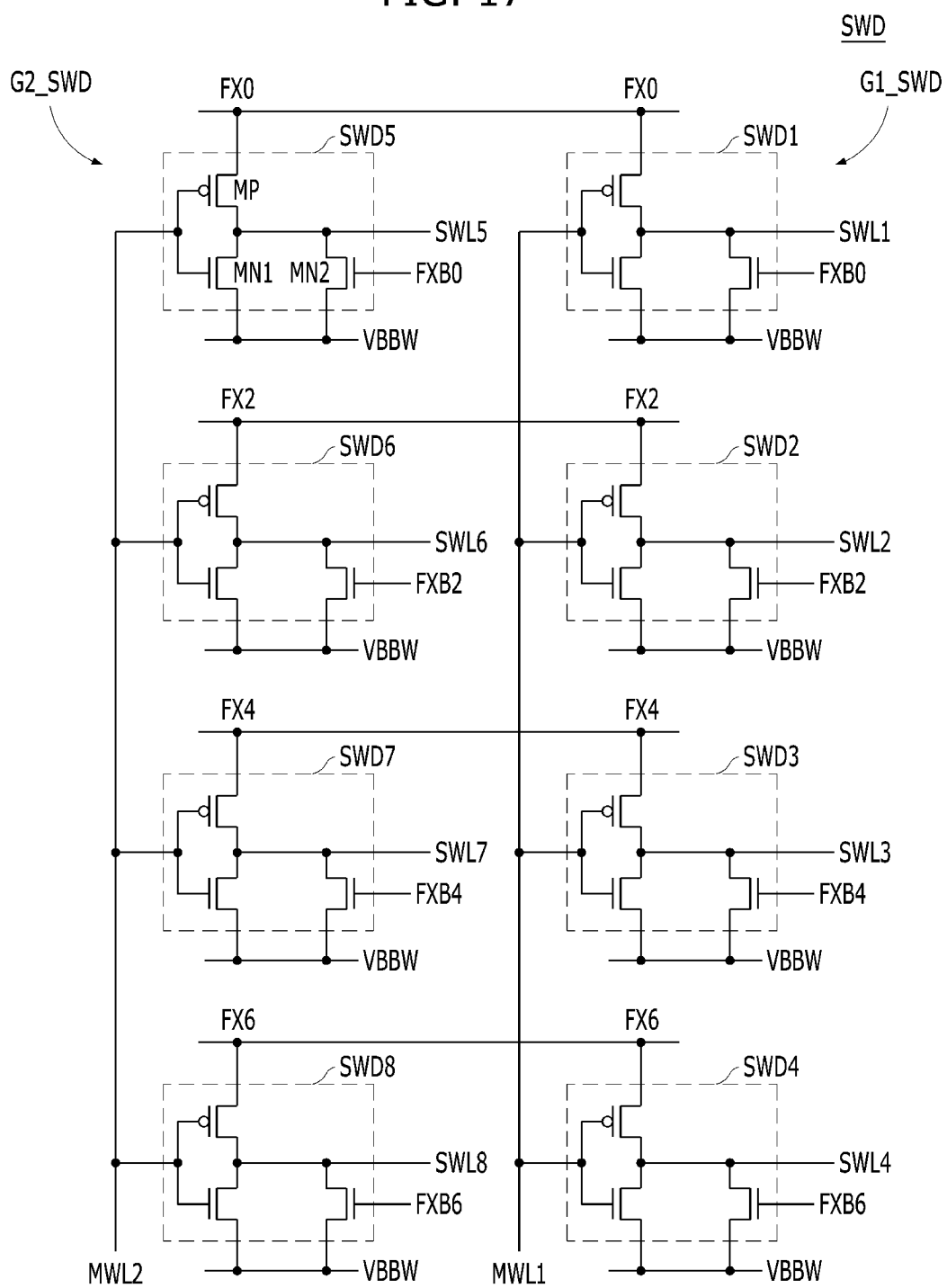
FIG. 17 is an equivalent circuit diagram illustrating a sub word line driver circuit SWD of FIG. 16.

FIG. 17 is an equivalent circuit diagram illustrating the sub word line driver circuit SWD of FIG. 16.

Referring to FIG. 17, the sub word line driver circuit SWD may include the first sub word line driver circuit group G1_SWD and the second sub word line driver circuit group G2_SWD. The first sub word line driver circuit group G1_SWD may include four sub word line drivers SWD1, SWD2, SWD3, and SWD4. The second sub word line driver circuit group G2_SWD may include four sub word line drivers SWD5, SWD6, SWD7, and SWD8.

The four sub word line drivers SWD1, SWD2, SWD3, and SWD4 of the first sub word line driver circuit group G1_SWD may be driven in response to a first main word line MWL1. Four sub word line drivers SWD5, SWD6, SWD7, and SWD8 of the second sub word line driver circuit group G2_SWD may be driven in response to a second main word line MWL2. The sub word line drivers SWD1 to SWD8 may be activated by first sub word line driver enable signals FX0, FX2, FX4, and FX6 and second sub word line driver enable signals FXB0, FXB2, FXB4, and FXB6. The activated sub word line drivers SWD1 to SWD8 may drive the sub word lines SWL1 to SWL8, respectively. The first sub word line driver circuit group G1_SWD and the second sub word line driver circuit group G2_SWD may receive the first sub word line driver enable signals FX0, FX2, FX4, and FX6 and the second sub word line driver enable signals FXB0, FXB2, FXB4, and FXB6 in common.

The second sub word line driver enable signals FXB0 to FXB6 may be inverted signals of the first sub word line driver enable signals FX0 to FX6. The first sub word line driver enable signals FX0 to FX6 and the second sub word line driver enable signals FXB0 to FXB6 may be provided from the first sub-hole circuits SH1 and SH2 (shown in FIG. 16).

Each of the sub word line drivers SWD1 to SWD8 may include one PMOSFET MP and two NMOSFETs MN1 and MN2.

Hereafter, the sub word line driver SWD5 will be taken as an example and described. In the sub word line driver SWD5, the gates of the PMOSFET MP and the NMOSFET MN1 are coupled to the second main word line MWL2, and the drains of the PMOFET MP and the NMOSFETs MN1 and MN2 are coupled to the sub word line SWL5. The first sub word line driver enable signal FX0 is applied to the source of the PMOSFET MP. The second sub word line driver enable signal FXB0 is applied to the gate of the NMOSFET MN2. A ground voltage VBBW is supplied to the sources of the NMOSFETs MN1 and MN2.

Figure 18:
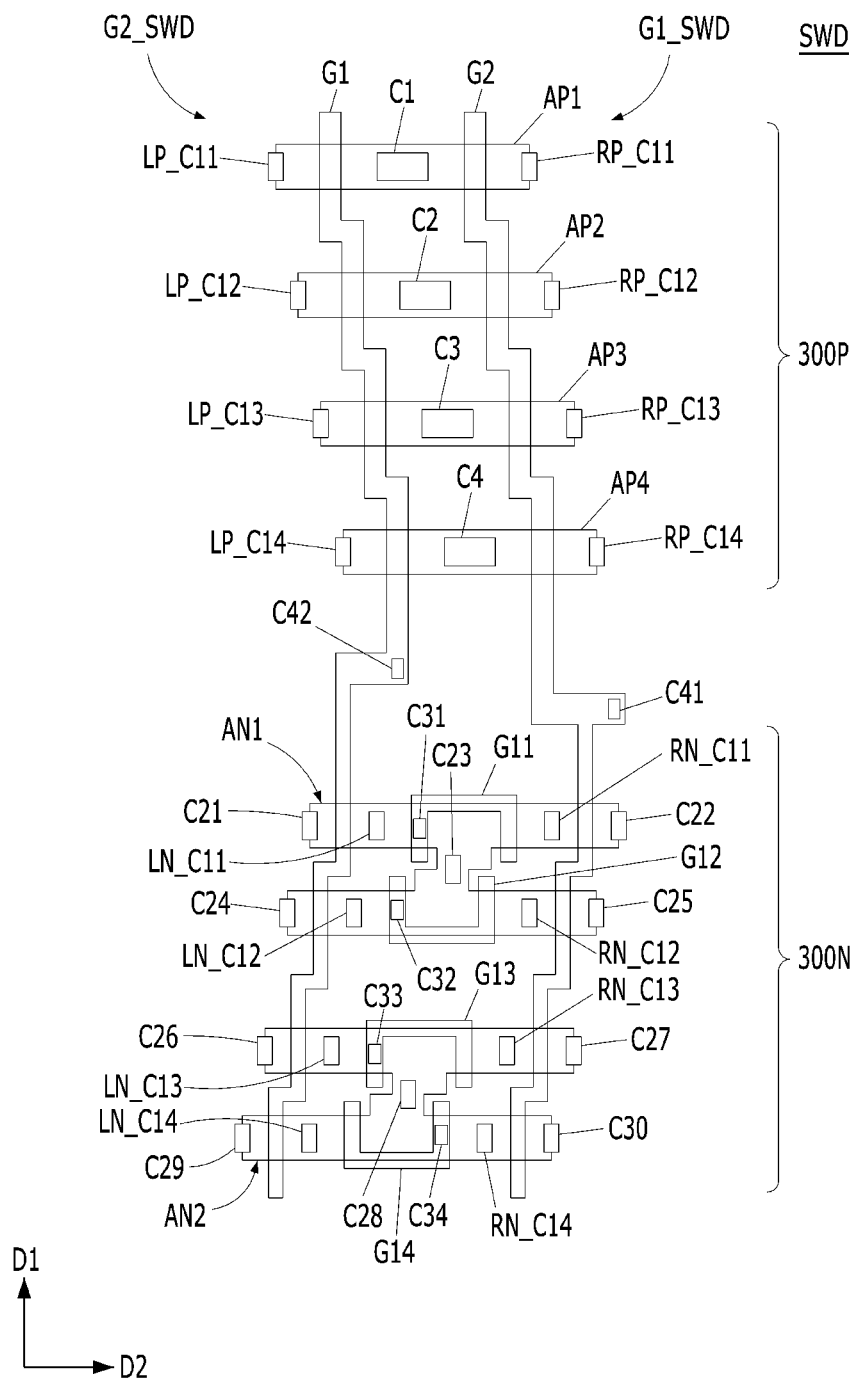
FIG. 18 is a layout illustrating the sub word line driver circuit SWD of FIG. 17.
Figure 19:
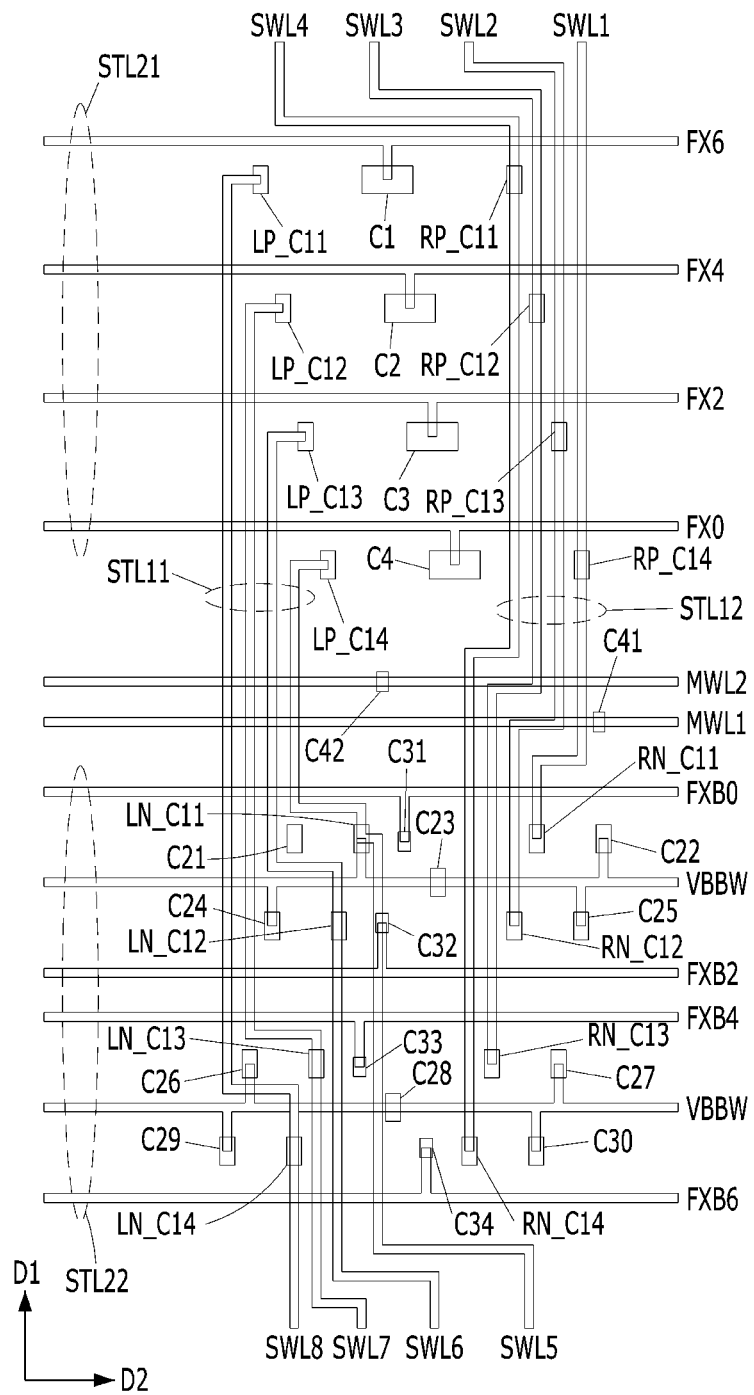
FIG. 19 is a view illustrating interconnections coupled to the contacts of FIG. 18.

FIG. 18 is a layout illustrating the sub word line driver circuit SWD of FIG. 17. FIG. 19 is a view illustrating interconnections coupled to the contacts of FIG. 18. Among the constituent elements shown in FIG. 18, only the interconnections and contacts are illustrated and described while the other constituent elements except for the contacts are omitted.

Referring to FIGS. 18 and 19, the first and second groups of the sub word line driver circuits G1_SWDL and G2_SWD may include a PMOSFET region 300P and an NMOSFET region 300N, individually. A plurality of active regions AP1 to AP4, AN1, and AN2 may be disposed in the PMOSFET region 300P and the NMOSFET region 300N. In this case, the first active regions AP1 to AP4 of the PMOSFET region 300P may be spaced apart from each other in a bar shape with a predetermined distance. The second active regions AN1 and AN2 of the NMOSFET region 300N may be formed in the shape of an 'H' in which the central portions of two neighboring sub active regions are coupled to each other. The first and second group sub word line driver circuits G1_SWDL and G2_SWD may share the first active regions AP1 to AP4 of the PMOSFET region 300P, and share the second active regions AN1 and AN2 of the NMOSFET region 300N.

The gates G1 and G2 which extend in the first direction D1 may be disposed over the first active regions AP1 to AP4 of the PMOSFET region 300P and the second active regions AN1 and AN2 of the NMOSFET region 300N. In this case, the gates G1 and G2 may be formed to have different line widths in the PMOSFET region 300P and the NMOSFET region 300N. For example, in the gates G1 and G2, the line width of a portion crossing the first active regions AP1 to AP4 of the PMOSFET region 300P may be formed greater than the line width of a portion crossing the second active regions AN1 and AN2 of the NMOSFET region 300N.

Among the gates G1 and G2, the second gate G2 may be coupled to the first main word line MWL1 for driving the first group sub word line driver G1_SWD, and the first gate G1 may be coupled to the second main word line MWL2 for driving the second group sub word line driver G2_SWD.

Selection gates G11, G12, G13, and G14 may be disposed over the second active regions AN1 and AN2 of the NMOSFET region 300N. The selection gates G11 to G14 may be disposed between the first gate G1 and the second gate G2, and the selection gates G11 to G14 may receive the second sub word line enable signals FXB0, FXB2, FXB4, and FXB6, respectively.

First contacts C1 to C4 coupled to the first sub word line driver enable signals FX0, FX2, FX4, and FX6 and second contacts LP_C11 to LP_C14 and RP_C11 to RP_C14 for connection to sub word lines SWL1 to SWL8 may be disposed in the first active regions AP1 to AP4 of the PMOSFET region 300P. The first contacts C1 to C4 may be disposed in the central portion of the first active regions AP1 to AP4 between the first gate G1 and the second gate G2.

The second contacts LP_C11 to LP_C14 and RP_C11 to RP_C14 may be positioned at both-side ends of the first active regions AP1 to AP4.

Third contacts LN_C11 to LN_C14 and RN_C11 to RN_C14 coupled to the sub word lines SWL1 to SWL8 and fourth contacts C21 to C30 coupled to the ground voltage VBBW may be disposed in the second active regions AN1 and AN2. The third contacts LN_C11 to LN_C14 may be disposed in a portion of the second active regions AN1 and AN2 between the first gate G1 and the selection gates G11 to G14, and the third contacts RN_C11 to RN_C14 may be disposed between the second gate G2 and the selection gates G11 to G14. Portions C21, C22, C24, C25, C26, C27, C29, and C30 of the fourth contacts C21 to C30 may be disposed on both-side edges of the second active regions AN1 and AN2. Also, portions C23 and C28 of the fourth contacts C21 to C30 may be disposed in the center of the second active regions AN1 and AN2, that is, between the neighboring selection gates G11, G12, G13, and G14.

Fifth contacts C31 to C34 that receive the second sub word line driver enable signals FXB0 to FXB6 may be disposed over the selection gates G11 to G14.

A sixth contact C41 coupled to the first main word line MWL1 may be disposed over the second gate G2, and a sixth contact C42 coupled to the second main word line MWL2 may be disposed over the first gate G1.

FIG. 19 illustrates an interconnection coupled to each of the contacts shown in FIG. 18 and describes only the interconnection and contacts while omitting the other constituent elements among the constituent elements shown in FIG. 18.

Referring to FIGS. 17 to 19, the sub word lines SWL1 to SWL8 may be respectively coupled to the drains of the PMOFET MP and the NMOSFETs MN1 and MN2 through the first interconnections STL11 and STL12. The first and second sub word line driver enable signals FX0 to FX6 and FXB0 to FXB6 and the ground voltage VBBW may be applied through the second interconnections STL21 and STL22. The sub word line drivers SWD1 to SWD8 may be coupled to the sub word lines SWL1 to SWL8 through the first interconnections STL11 and STL12.

The first and second interconnections STL11, STL12, STL21, and STL22 may have a multi-layer level structure. In the multi-layer level structure, first interconnections STL11 and STL12 may be positioned at a lower level, and second interconnections STL21 and STL22 may be positioned at a higher level than the first interconnections STL11 and STL12. The first interconnections STL11 and STL12 and the second interconnections STL21 and STL22 may include metal-based materials such as tungsten, aluminum, and copper. The first interconnections STL11 and STL12 and the second interconnections STL21 and STL22 may be individually referred to as metal lines. Therefore, the first interconnections STL11 and STL12 and the second interconnections STL21 and STL22 may be referred to as multi-layer level metal lines MLMs. The first interconnections STL11 and STL12 may include a plurality of first interconnection lines, and the first interconnection lines may be spaced apart from each other and extend in the first direction D1. The second interconnections STL21 and STL22 may include a plurality of second interconnection lines, and the second interconnection lines may be spaced apart from each other and extend in the second direction D2.

The first interconnections STL11 and STL12 may couple the sub word lines SWL1 to SWL8 and the sub word line drivers SWD1 to SWD8 to each other. The second interconnections STL21 and STL22 may couple the first and second sub-hole circuits SH1 and SH2 and the sub word line drivers SWD1 to SWD8 to each other.

The first interconnections STL11 and STL12 may be coupled to the sub word line drivers SWD1 to SWD8 through the second contacts LP_C11 to LP_C14 and RP_C11 to RP_C14 and the third contacts LN_C11 to LN_C14 and RN_C11 to RN_C14. For example, the sub word line drivers SWD1 to SWD4 may be coupled to the sub word line drivers SWD1 to SWD4 through the second contacts RP_C11 to RP_C14 and the third contacts RN_C11 to RN_C14. The sub word line drivers SWD5 to SWD8 may be coupled to the sub word line drivers SWD5 to SWD8 through the second contacts LP_C11 to LP_C14 and the third contacts LN_C11 to LN_C14.

The second interconnections STL21 and STL22 may be coupled to the sub word line drivers SWD1 to SWD8 through the first contacts C1 to C4 and the fourth contacts C21 to C30.

The first and second main word lines MWL1 and MWL2 may be positioned at a higher level than the second interconnections STL21 and STL22. The first and second main word lines MWL1 and MWL2 may be referred to as third interconnections. The first interconnections STL11 and STL12 may extend in the first direction D1. The second interconnections STL21 and STL22 may extend in the second direction D2. The first and second main word lines MWL1 and MWL2 may extend in the second direction D2. A portion of the first interconnections STL11 and STL12 may have a bending structure.

Figure 20A:
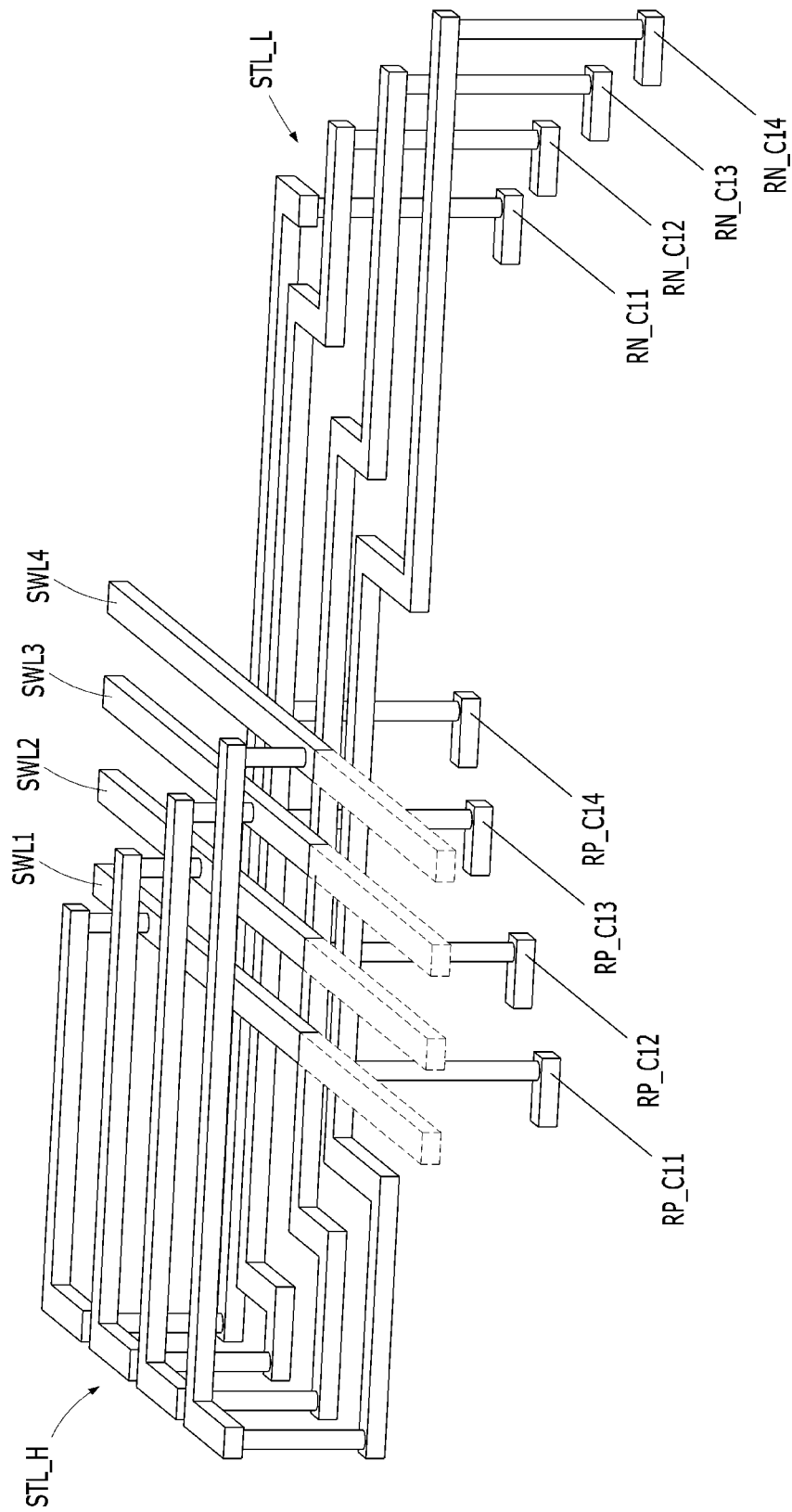
FIG. 20A is a perspective view illustrating a connection relationship between a first group sub word line and a first group sub word line driver circuit.
Figure 20B:
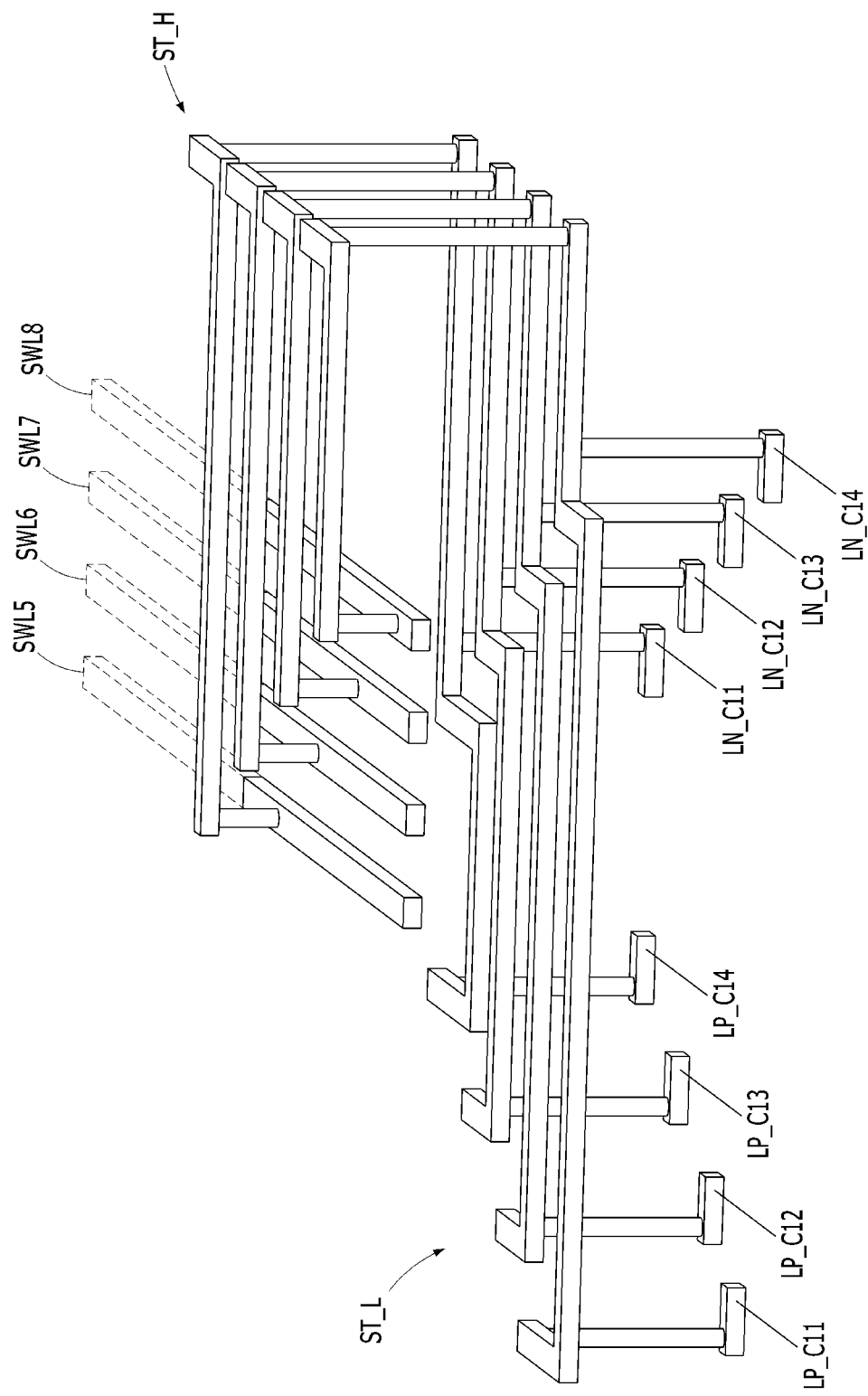
FIG. 20B is a perspective view illustrating a connection relationship between a second group sub word line and a second group sub word line driver circuit.

FIG. 20A is a perspective view illustrating a connection relationship between a first group sub word line and the first group sub word line driver circuit. FIG. 20B is a perspective view illustrating a connection relationship between a second group sub word line and the second group sub word line driver circuit.

Referring to FIG. 20A, the first group sub word lines SWL1, SWL2, SWL3, and SWL4 may be coupled to the contacts RP_C11 to RP_C14 and RN_C11 to RN_C14 of the first sub word line driver group G1_SWD through the multi-layer level interconnections STL_L and STL_H.

Referring to FIG. 20B, the second group sub word line stacks SWL5, SWL6, SWL7, and SWL8 may be coupled to the contacts LP_C11 to LP_C14 and LN_C11 to LN_C14 of the second group sub word line driver G2_SWD through the multi-layer level interconnections STL_L and STL_H.

The multi-layer level interconnections STL_L and STL_H may include a low-level interconnection STL_L and a high-level interconnection STL_H. The low-level interconnection STL_L may be positioned underneath the high-level interconnection STL_H. The low-level interconnection STL_L and the high-level interconnection STL_H may include vias and metal lines, individually.

The multi-layer level interconnections STL_L and STL_H may correspond to the first interconnections STL11 and STL12 of FIG. 19. The multi-layer level interconnections STL_L and STL_H may be referred to as strapping units.

Figure 21:
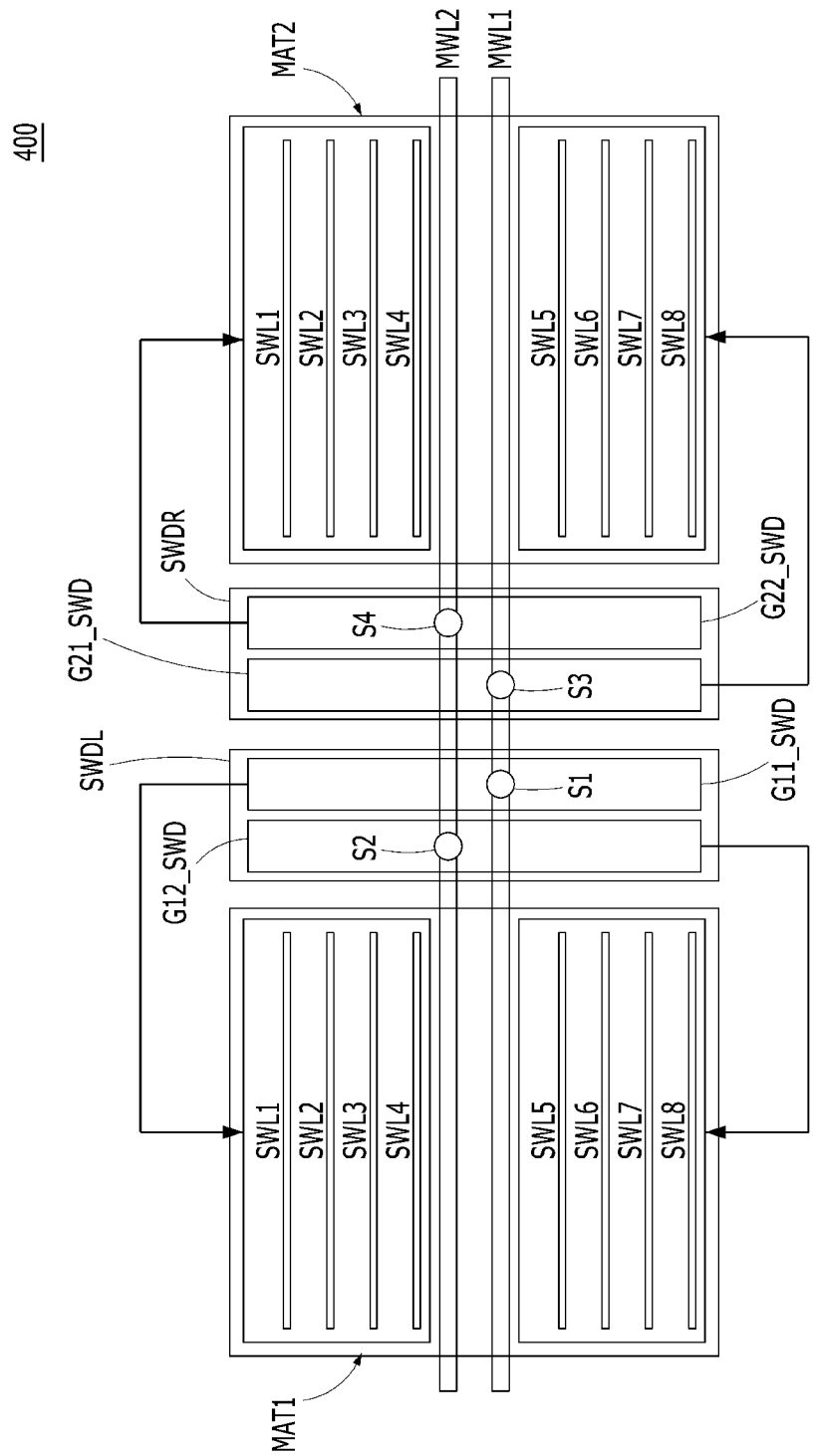
FIGS. 21 to 24E are views illustrating a memory device in accordance with other embodiments of the present invention.

FIG. 21 is a schematic diagram illustrating a memory device in accordance with another embodiment of the present invention.

Referring to FIG. 21, the memory device 400 may include a plurality of memory cell mats MAT1 and MAT2. The memory cell mats MAT1 and MAT2 may be arranged in a row direction and may include a first memory cell mat MAT1 and a second memory cell mat MAT2. A pair of sub word line driver circuits SWDL and SWDR may be disposed between the first memory cell mat MAT1 and the second memory cell mat MAT2. In other words, the first and second sub word line driver circuits SWDL and SWDR may be disposed between the first memory cell mat MAT1 and the second memory cell mat MAT2. For the sake of convenience in description, the first and second sub word line driver circuits SWDL and SWDR are illustrated to be disposed between the first memory cell mat MAT1 and the second memory cell mat MAT2. However, the first and second sub word line driver circuits SWDL and SWDR may be positioned underneath the one-side ends of the first memory cell mat MAT1 and the second memory cell mat MAT2, respectively. The first sub word line driver circuit SWDL may be positioned underneath the one-side end of the first memory cell mat MAT1, and the second sub word line driver circuit SWDR may be positioned underneath the one-side end of the second memory cell mat MAT2. The first sub word line driver circuit SWDL and the second sub word line driver circuit SWDR may be symmetrical to each other between the first memory cell mat MAT1 and the second memory cell mat MAT2.

The first memory cell mat MAT1 may include a plurality of sub word lines SWL1 to SWL8. The second memory cell mat MAT2 may include a plurality of sub word lines SWL1 to SWL8. The first sub word line driver circuit SWDL may be positioned underneath ends of the sub word lines SWL1 to SWL8 of the first memory cell mat MAT1. The sub word line driver circuit SWDR may be positioned underneath the ends of the sub word lines SWL1 to SWL8 of the second memory cell mat MAT2.

The first sub word line driver circuit SWDL may include first and second sub word line driver circuit groups G11_SWD and G12_SWD. The second sub word line driver circuit SWDR may include first and second sub word line driver circuit groups G21_SWD and G22_SWD.

The first and second groups of the sub word line driver circuits G11_SWD, G12_SWD, G21_SWD, and G22_SWD may be the same as those of FIGS. 17 to 19, respectively. The first and second groups of the sub word line drivers G11_SWD and G12_SWD may be coupled to the sub word lines SWL1 to SWL8 of the first memory cell mat MAT1. The first and second group sub word line driver circuits G21_SWD and G22_SWD may be coupled to the sub word lines SWL1 to SWL8 of the second memory cell mat MAT2. Each of the first and second groups of the sub word line driver circuits G11_SWD, G12_SWD, G21_SWD, and G22_SWD may include four sub word line drivers.

The first sub word line driver circuit group G11_SWD may drive the sub word line stacks SWL1 to SWL4 of the first memory cell mat MAT1. The second sub word line driver circuit group G12_SWD may drive the sub word line stacks SWL5 to SWL8 of the first memory cell mat MAT1. The first sub word line driver circuit group G21_SWD may drive the sub word line stacks SWL5 to SWL8 of the second memory cell mat MAT2. The second sub word line driver circuit group G22_SWD may drive the sub word line stacks SWL1 to SWL4 of the second memory cell mat MAT2.

The first sub word line driver circuit group G11_SWD may be coupled to the first main word line MWL1 through a contact S1. The second sub word line driver circuit group G12_SWD may be coupled to the second main word line MWL2 through a contact S2. The first sub word line driver circuit group G11_SWD may be activated by the first main word line MWL1 and may drive the sub word lines SWL1 to SWL4 of the first memory cell mat MAT1. The sub word lines SWL1 to SWL4 may be referred to as first group horizontal level sub word lines. The second sub word line driver circuit group G12_SWD may be activated by the second main word line MWL2 and may drive the sub word lines SWL5 to SWL8 of the first memory cell mat MAT1. The sub word lines SWL5 to SWL8 may be referred to as second group horizontal level sub word lines.

The first sub word line driver circuit group G21_SWD may be coupled to the first main word line MWL1 through a contact S3, and the second sub word line driver circuit group G22_SWD may be coupled to the second main word line MWL2 through a contact S4. The first sub word line driver circuit group G21_SWD may be activated by the first main word line MWL1 and may drive the sub word lines SWL5 to SWL8 of the second memory cell mat MAT2. The sub word lines SWL5 to SWL8 may be referred to as second group horizontal level sub word lines. The second sub word line driver circuit group G22_SWD may be activated by the second main word line MWL2 and may drive the sub word lines SWL1 to SWL4 of the second memory cell mat MAT2. The sub word lines SWL1 to SWL4 may be referred to as first group horizontal level sub word lines.

As described above, the first group horizontal level sub word lines SWL1 to SWL4 of the first memory cell mat MAT1 and the second group horizontal level sub word lines SWL5 to SWL8 of the second memory cell mat MAT2 may be simultaneously driven by the first main word line MWL1. Also, the second group horizontal level sub word lines SWL4 to SWL8 of the first memory cell mat MAT1 and the first group horizontal level sub word lines SWL1 to SWL4 of and the second memory cell mat MAT2 may be simultaneously driven by the second main word line MWL2.

Hereinafter, the sub word line driver circuits of the subsequent embodiments of the present invention may be the same as those of FIG. 21.

Figure 22:
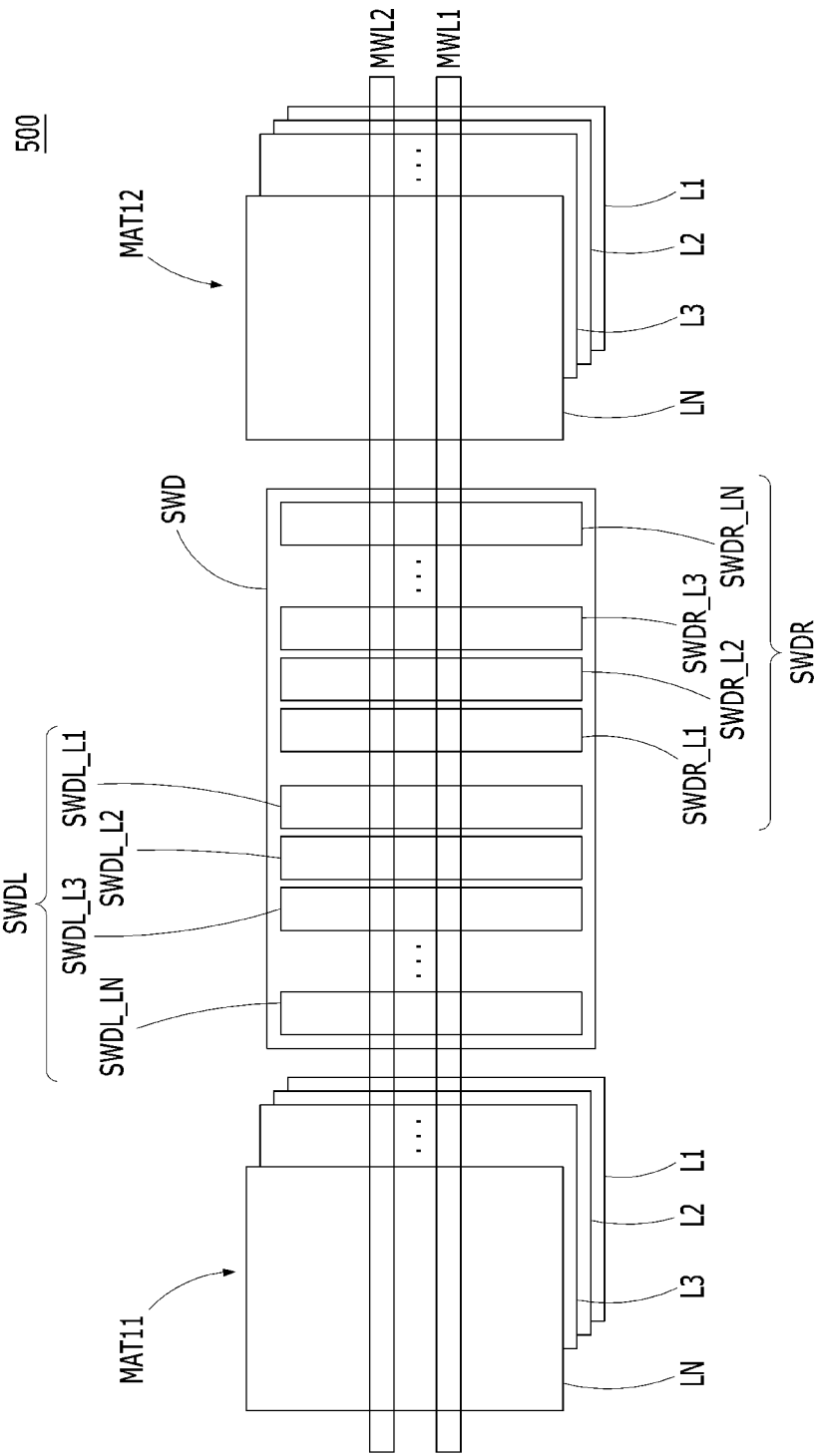
Figure 23:
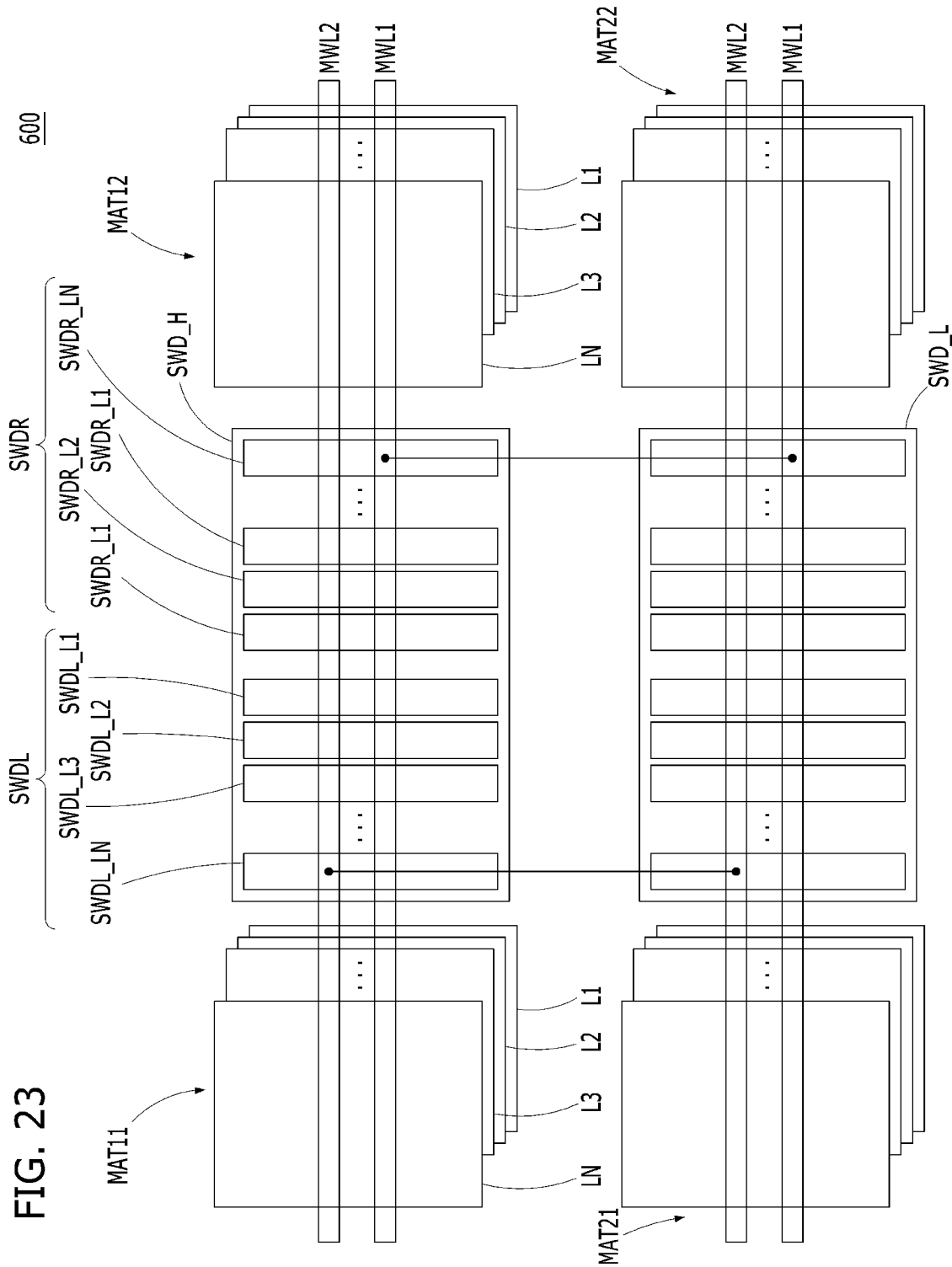

FIGS. 22 and 23 are schematic views illustrating a memory device in accordance with another embodiment of the present invention. The memory device of FIG. 22 may be driven by a 1:8 coding scheme, and the memory device of FIG. 23 may be driven by a 1:16 coding scheme.

Referring to FIG. 22, the memory device 500 may include a plurality of memory cell mats MAT11 and MAT12. The memory cell mats MAT11 and MAT12 may be arranged in a row direction and may include a first memory cell mat MAT11 and a second memory cell mat MAT12.

Each of the first and second memory cell mats MAT11 and 12 may include a multi-layer level memory cell mat. In other words, the first and second memory cell mats MAT11 and 12 may include sub word lines of the multi-layer levels L1 to LN. The sub word lines may gradually increase in height from the lowest level L1 to the highest level LN. At each level, a plurality of sub word lines may be arranged in a horizontal arrangement. For example, as shown in FIG. 21, eight sub word lines SWL1 to SWL8 may be arranged in a horizontal arrangement at each level.

The sub word line driver circuit SWD may be disposed between the first memory cell mat MAT11 and the second memory cell mat MAT12. The sub word line driver circuit SWD may include first and second sub word line driver circuits SWDL and SWDR. For the sake of convenience in description, the first and second sub word line driver circuits SWDL and SWDR are illustrated to be disposed between the first memory cell mat MAT11 and the second memory cell mat MAT12. However, the first and second sub word line driver circuits SWDL and SWDR may be positioned underneath the one-side ends of the first memory cell mat MAT11 and the second memory cell mat MAT12, respectively. The first sub word line driver circuit SWDL may be positioned underneath the one-side end of the first memory cell mat MAT11, and the second sub word line driver circuit SWDR may be positioned underneath the one-side ends of the second memory cell mat MAT12. The first sub word line driver circuit SWDL and the second sub word line driver circuit SWDR may be symmetrical to each other between the first memory cell mat MAT11 and the second memory cell mat MAT12. The first sub word line driver circuit SWDL may drive the sub word lines of the first memory cell mat MAT11, and the second sub word line driver circuit SWDR may drive the sub word lines of the second memory cell mat MAT12.

The first sub word line driver circuit SWDL may include first horizontal level sub word line driver circuits SWDL_L1 to SWDL_LN. The first horizontal level sub word line driver circuits SWDL_L1 to SWDL_LN may refer to a plurality of sub word line driver circuits that are laterally arranged. The first horizontal level sub word line driver circuits SWDL_L1 to SWDL_LN may drive the multi-layer level sub word lines. For example, the first horizontal level sub word line driver circuit SWDL_L1 may drive the sub word lines of the lowest level L1. The first horizontal level sub word line driver circuit SWDL_LN may drive the sub word lines of the highest level LN. As such, the first horizontal level sub word line driver circuit SWDL_L1 may be formed to correspond to the sub word lines of each layer. The first horizontal level sub word line driver circuit SWDL_L1 for driving the sub word lines of the lowest level L1 may be disposed in the center of the sub word line driver circuit SWD. The first horizontal level sub word line driver circuit SWDL_LN for driving the sub word lines of the highest level LN may be positioned at an edge of the sub word line driver circuit SWD.

The second sub word line driver circuit SWDR may include second horizontal level sub word line driver circuits SWDR_L1 to SWDR_LN. The second horizontal level sub word line driver circuits SWDR_L1 to SWDR_LN may refer to a plurality of sub word line driver circuits that are laterally arranged. The second horizontal level sub word line driver circuits SWDR_L1 to SWDR_LN may drive the sub word lines of multi-layer levels L1 to LN. For example, the second horizontal level sub word line driver circuit SWDR_L1 may drive the sub word lines of the lowest level L1, and the second horizontal level sub word line driver circuit SWDR_LN may drive the sub word lines of the highest level LN. As such, the second horizontal level sub word line driver circuit SWDR_L1 may be formed to correspond to the sub word lines of each layer. The second horizontal level sub word line driver circuit SWDR_L1 for driving the sub word lines of the lowest level L1 may be disposed in the center of the sub word line driver circuit SWD. The second horizontal level sub word line driver circuit SWDR_LN for driving the sub word lines of the highest level LN may be positioned at an edge of the sub word line driver circuit SWD.

Each of the first and second horizontal level sub word line driver circuits SWDL_L1 to SWDL_LN and SWDR_L1 to SWDR_LN may include the first and second group sub word line driver circuits G11_SWD, G12_SWD, G21_SWD, and G22_SWD, as shown in FIG. 21.

The sub word lines at each level among the sub word lines of the multi-layer levels L1 to LN may be driven by the method described with reference to FIG. 21.

Referring to FIG. 23, a memory device 600 may include a plurality of memory cell mats MAT11, MAT12, MAT21, and MAT22. The memory cell mats MAT11, MAT12, MAT21, and MAT22 may be arranged in a row direction and a column direction, and may include four memory cell mats MAT11, MAT12, MAT21, and MAT22.

Each of the memory cell mats MAT11, MAT12, MAT21, and MAT22 may be a multi-layer level memory cell mat. Accordingly, each of the memory cell mats MAT11, MAT12, MAT21, and MAT22 may include sub word lines of the multi-layer levels L1 to LN. The sub word lines may gradually increase in height from the lowest level L1 to the highest level LN. At each level, a plurality of sub word lines may be arranged in a horizontal arrangement. For example, as shown in FIG. 21, eight sub word lines SWL1 to SWL8 may be arranged in a horizontal arrangement at each level.

A sub word line driver circuit SWD_H may be disposed between the first memory cell mat MAT11 and the second memory cell mat MAT12. The sub word line driver circuit SWD_H may include first and second sub word line driver circuits SWDL and SWDR. A sub word line driver circuit SWD_L may be disposed between a third memory cell mat MAT21 and a fourth memory cell mat MAT22. The sub word line driver circuit SWD_L may include first and second sub word line driver circuits SWDL and SWDR in the same manner as the sub word line driver circuit SWD_H. The sub word line driver circuits SWD_H and SWD_L may be the same as the sub word driver circuit SWD of FIG. 22.

In the memory device 600 of FIG. 23, the sub word line driver circuits SWD_H and SWD_L of the two memory cell mats MAT11 and MAT21 in the column direction may share the first and second main word lines MWL1 and MWL2. Accordingly, the sub word lines may be driven by the 1:16 coding scheme. In other words, 16 sub word line drivers may be activated by one main word line, thereby driving 16 sub word lines.

In order to share the first and second main word lines MWL1 and MWL2 with each other, for example, gates of the sub word line drivers neighboring in a column direction may be coupled to each other.

According to some embodiments of the present invention, the first and second sub-hole circuits SH1 and SH2 may be disposed over the substrate to overlap with a memory cell mat. In other words, other than the structure in which the first and second sub-hole circuits SH1 and SH2 are positioned between the upper memory cell mat and the lower memory cell mat, the first and second sub-hole circuits SH1 and SH2 may be positioned underneath each memory cell mat.

According to the embodiments of the present invention described above, the net die may be increased by arranging the sub word line driver circuits underneath the memory cell mat.

FIGS. 24A to 24E are diagrams illustrating a memory device in accordance with another embodiment of the present invention.

Figure 24A:
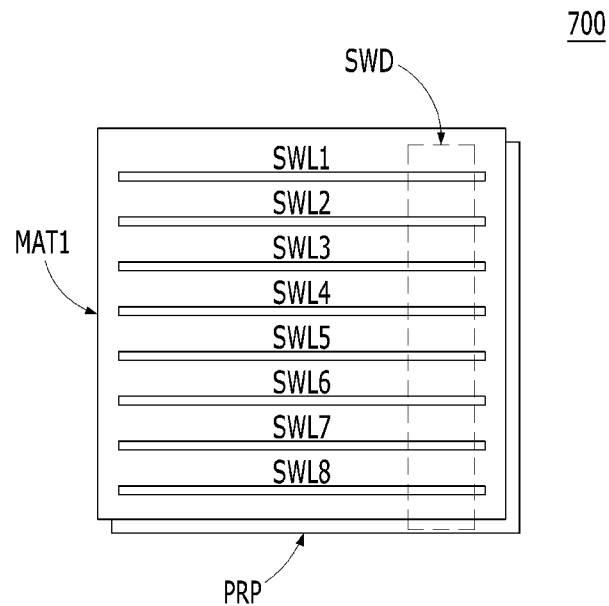

Referring to FIG. 24A, the memory device 700 may include a memory cell mat MAT1 and a peripheral circuit portion PRP. The memory cell mat MAT1 may be positioned above the peripheral circuit portion PRP. The memory cell mat MAT1 may include a plurality of sub word lines. For example, the memory cell mat MAT1 may include eight sub word lines SWL1 to SWL8. The sub word lines SWL1 to SWL8 may be individually formed of sub word lines that are stacked vertically, just as shown in FIG. 14A.

The peripheral circuit portion PRP may include at least one or more control circuits. The peripheral circuit portion PRP may include a sub word line driver circuit SWD. The sub word line driver circuit SWD may be positioned underneath one-side edge of the memory cell mat MAT1. The sub word line driver circuit SWD may not be positioned underneath the other-side edge of the memory cell mat MAT1.

The sub word line driver circuit SWD may be positioned underneath the one-side end of the memory cell mat MAT1. Herein, the one-side end of the memory cell mat MAT1 may be stepped ends of the sub word lines SWL1 to SWL8 on one side of the sub word lines SWL1 to SWL8. The sub word line driver circuit SWD may drive all of the sub word lines SWL1 to SWL8.

The sub word line driver circuit SWD may not be positioned underneath the stepped ends of the sub word lines SWL1 to SWL8 on another side.

Figure 24B:
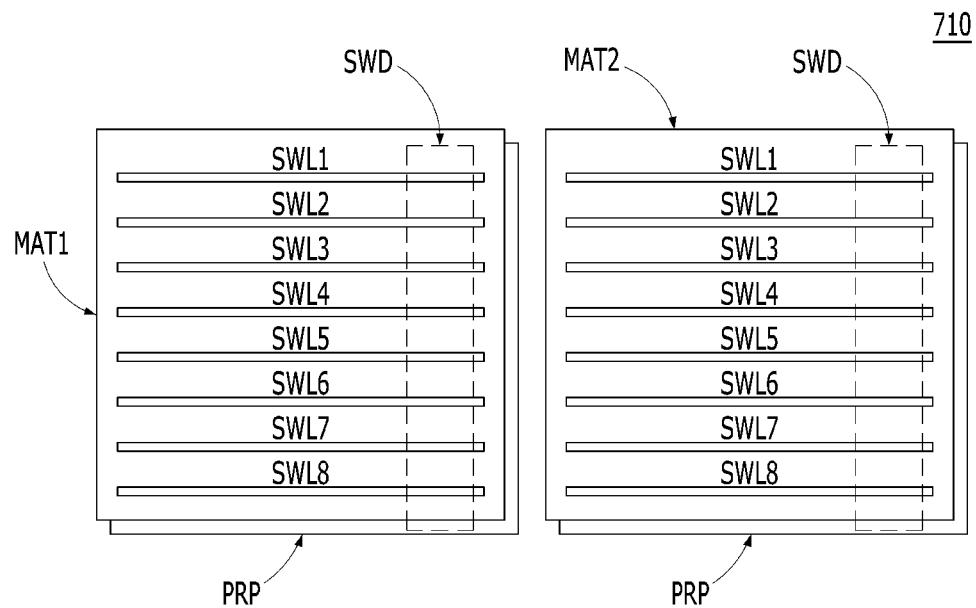

Referring to FIG. 24B, the memory device 710 may include a plurality of memory cell mats MAT1 and MAT2. The memory cell mats MAT1 and MAT2 may be arranged in the row direction.

The sub word line driver circuit SWD may be positioned underneath the one-side ends of the memory cell mats MAT1 and MAT2. Herein, the one-side ends of the memory cell mats MAT1 and MAT2 may be stepped ends of the sub word lines SWL1 to SWL8. The sub word line driver circuit SWD may drive all of the sub word lines SWL1 to SWL8.

From the perspective of the memory cell mat MAT1, the sub word line driver circuit SWD may be positioned underneath the right side of the memory cell mat MAT1. The sub word line driver circuit SWD may not be positioned underneath the left side of the memory cell mat MAT1. From the perspective of the memory cell mat MAT2, the sub word line driver circuit SWD may be positioned underneath the right side of the memory cell mat MAT2. The sub word line driver circuit SWD may not be positioned underneath the left side of the memory cell mat MAT2.

Figure 24C:
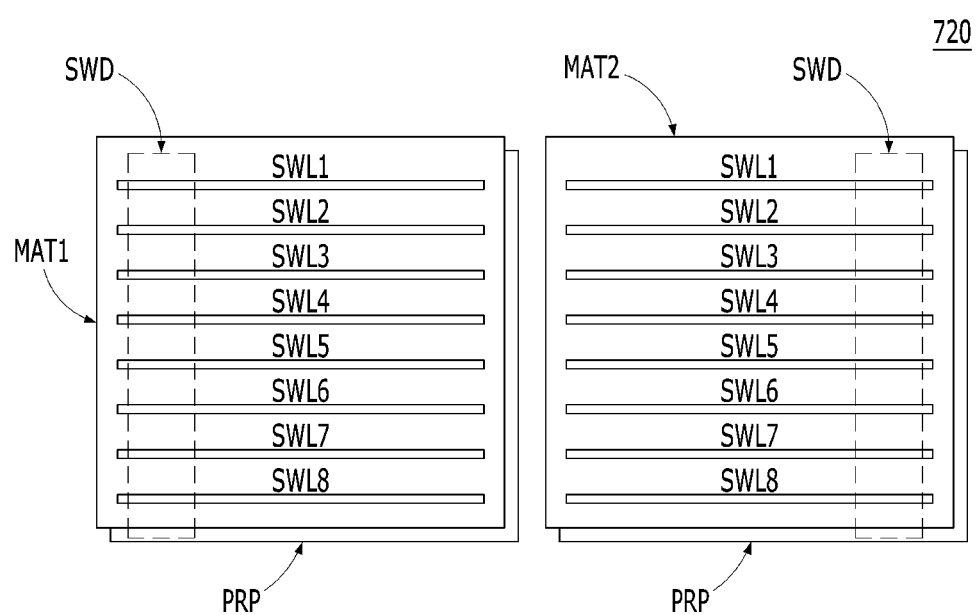

Referring to FIG. 24C, the memory device 720 may include a plurality of memory cell mats MAT1 and MAT2. The memory cell mats MAT1 and MAT2 may be arranged in the row direction.

The sub word line driver circuit SWD may be positioned underneath the one-side ends of the memory cell mats MAT1 and MAT2. Herein, the one-side ends of the memory cell mats MAT1 and MAT2 may be stepped ends of the sub word lines SWL1 to SWL8 on one side. The sub word line driver circuit SWD may drive all of the sub word lines SWL1 to SWL8.

From the perspective of the memory cell mat MAT1, the sub word line driver circuit SWD may be positioned underneath the left side of the memory cell mat MAT1. The sub word line driver circuit SWD may not be positioned underneath the right side of the memory cell mat MAT1. From the perspective of the memory cell mat MAT2, the sub word line driver circuit SWD may be positioned underneath the right side of the memory cell mat MAT2. The sub word line driver circuit SWD may not be positioned underneath the left side of the memory cell mat MAT2.

Figure 24D:
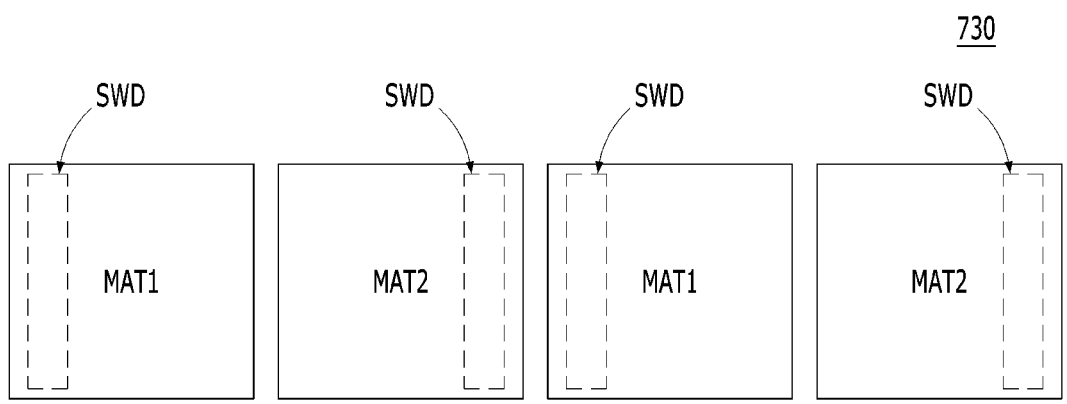

Referring to FIG. 24D, the memory device 730 may include a plurality of memory cell mats MAT1 and MAT2. The memory cell mats MAT1 and MAT2 may be alternately arranged in the row direction.

The sub word line driver circuit SWD may be positioned underneath the one-side ends of the memory cell mats MAT1 and MAT2.

From the perspective of the memory cell mat MAT1, the sub word line driver circuit SWD may be positioned underneath the left side of the memory cell mat MAT1. The sub word line driver circuit SWD may not be positioned underneath the right side of the memory cell mat MAT1. From the perspective of the memory cell mat MAT2, the sub word line driver circuit SWD may be positioned underneath the right side of the memory cell mat MAT2. The sub word line driver circuit SWD may not be positioned underneath the left side of the memory cell mat MAT2.

Figure 24E:
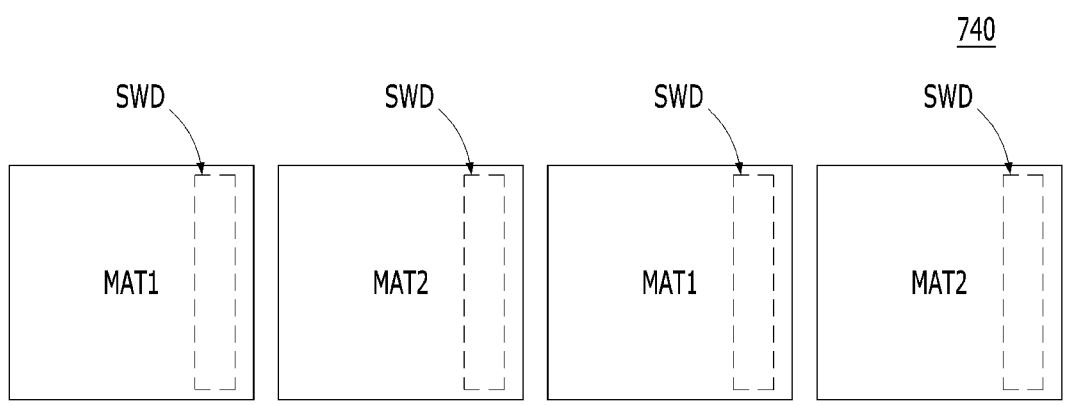

Referring to FIG. 24E, the memory device 740 may include a plurality of memory cell mats MAT1 and MAT2. The memory cell mats MAT1 and MAT2 may be alternately arranged in the row direction.

The sub word line driver circuit SWD may be positioned underneath the one-side ends of the memory cell mats MAT1 and MAT2.

From the perspective of the memory cell mat MAT1, the sub word line driver circuit SWD may be positioned underneath the right side of the memory cell mat MAT1. The sub word line driver circuit SWD may not be positioned underneath the left side of the memory cell mat MAT1. From the perspective of the memory cell mat MAT2, the sub word line driver circuit SWD may be positioned underneath the right side of the memory cell mat MAT2. The sub word line driver circuit SWD may not be positioned underneath the left side of the memory cell mat MAT2.

Referring to FIGS. 24A to 24E, the net die may be increased by reducing the occupied area of the sub word line driver circuit SWD.

According to embodiments of the present invention, it is possible to increase cell density and to reduce parasitic capacitance by vertically stacking memory cells so as to form a three-dimensional structure.

According to embodiments of the present invention, interference between the vertically stacked memory cells may be prevented because a transistor of a memory cell includes double word lines.

According to embodiments of the present invention, since bit lines are formed as vertically oriented from a plane of a peripheral structure, bit line resistance may be reduced.

According to embodiments of the present invention, a memory device that is highly integrated within a limited area may be realized by vertically stacking memory cells in the upper or lower portion of a peripheral circuit portion.

According to embodiments of the present invention, the characteristic margin may be improved according to the increase in a transistor pitch by forming sub word line drivers underneath the memory cell mat.

While the present invention has been described with respect to specific embodiments, it will be apparent to those skilled in the art that various changes and modifications may be made without departing from the spirit and scope of the invention as defined in the following claims.

What is claimed is:

1. A memory device, comprising:
a peripheral circuit portion including a sub word line driver circuit;
a bit line oriented vertically over the peripheral circuit portion;
a capacitor positioned over the peripheral circuit portion; and
an active layer oriented laterally between the bit line and the capacitor; and
a word line extending along a direction intersecting the active layer,
wherein the sub word line driver circuit is positioned underneath the end of the word line.

2. The memory device of claim 1, further comprising:
an interconnection that electrically connects the end of the word line to the sub word line driver circuit.

3. The memory device of claim 1, wherein the active layer includes:
a first source/drain region coupled to the bit line;
a second source/drain region coupled to the capacitor; and
a channel between the first source/drain region and a second source/drain region, and
the first source/drain region, the channel, and the second source/drain region are positioned in a lateral arrangement between the bit line and the capacitor.

4. The memory device of claim 1, wherein the word line includes:
a lower word line on a top surface of the active layer; and
an upper word line on a bottom surface of the active layer, wherein the lower and upper word lines parallel to each other.

5. The memory device of claim 4, wherein the lower word line and the upper word line are vertically stacked with the active layer therebetween.

6. The memory device of claim 4, further includes:
a first gate dielectric layer is formed between the upper word line and the active layer; and
a second gate dielectric layer is formed between the lower word line and the active layer.

7. The memory device of claim 4, wherein the lower word line and the upper word line are applied with the same potential.

8. The memory device of claim 1, wherein the capacitor includes:
a first node;
a second node; and
a dielectric material between the first node and the second node,
wherein the first node has a lateral cylindrical shape.

9. The memory device of claim 1, wherein the bit line, the active layer, the word line, and the capacitor correspond to a memory cell of a memory cell mat, and
the memory cell mat is positioned over the peripheral circuit portion.

10. The memory device of claim 9, wherein the memory cell mat and the peripheral circuit portion are electrically connected through conductive bonding pads.

11. The memory device of claim 1, wherein the active layer comprises a semiconductor material.

* * * * *